(12) United States Patent
Inoue et al.

(10) Patent No.: US 10,634,996 B2
(45) Date of Patent: Apr. 28, 2020

(54) COMPOSITE MEMBER AND METHOD OF MANUFACTURING THE SAME, AND ALIPHATIC POLYCARBONATE-CONTAINING LAYER

(71) Applicants: Japan Advanced Institute of Science and Technology, Ishikawa (JP); Sumitomo Seika Chemicals Co., Ltd., Hyogo (JP)

(72) Inventors: Satoshi Inoue, Nagano (JP); Tatsuya Shimoda, Ishikawa (JP); Kazuhiro Fukada, Hiroshima (JP); Kiyoshi Nishioka, Hyogo (JP); Masahiro Suzuki, Hyogo (JP)

(73) Assignees: JAPAN ADVANCED INSTITUTE OF SCIENCE AND TECHNOLOGY, Ishikawa (JP); SUMITOMO SEIKA CHEMICALS CO., LTD., Hyogo (JP)

( * ) Notice: Subject to any disclaimer, the term of this patent is extended or adjusted under 35 U.S.C. 154(b) by 51 days.

(21) Appl. No.: 15/759,053

(22) PCT Filed: Jul. 21, 2016

(86) PCT No.: PCT/JP2016/071387
§ 371 (c)(1),
(2) Date: Mar. 9, 2018

(87) PCT Pub. No.: WO2017/047227
PCT Pub. Date: Mar. 23, 2017

(65) Prior Publication Data
US 2019/0041744 A1    Feb. 7, 2019

(30) Foreign Application Priority Data

Sep. 18, 2015 (JP) .................................. 2015-185569
Nov. 12, 2015 (JP) .................................. 2015-221926

(51) Int. Cl.
*G03F 7/00* (2006.01)
*H01L 21/28* (2006.01)
(Continued)

(52) U.S. Cl.
CPC ............ *G03F 7/0002* (2013.01); *B29C 59/02* (2013.01); *G03F 7/2002* (2013.01); *H01L 21/28* (2013.01);
(Continued)

(58) Field of Classification Search
CPC ........................ Y10T 428/24355; B29C 59/02
(Continued)

(56) References Cited

U.S. PATENT DOCUMENTS

| 5,412,062 A | 5/1995 | Power et al. |
| 2004/0146803 A1 | 7/2004 | Kohl et al. |

(Continued)

FOREIGN PATENT DOCUMENTS

| EP | 3032576 A1 | 6/2016 |
| EP | 3086360 A1 | 10/2016 |

(Continued)

OTHER PUBLICATIONS

International Search Report for PCT/JP2016/071387 dated May 24, 2016, 2 pp.

(Continued)

*Primary Examiner* — Betelhem Shewareged
(74) *Attorney, Agent, or Firm* — Buckley, Maschoff & Talwalkar LLC

(57) ABSTRACT

[Problem] Provided is a composite member which can contribute to simple formation and/or increased quality of fine wiring. [Solution] A composite member 100 according to one embodiment of the present invention includes a base material, an aliphatic polycarbonate-containing layer with multiple island-shaped portions arranged on the base mate- (Continued)

rial, and a metal ink, wherein at least a surface of the aliphatic polycarbonate-containing layer with multiple island-shaped portions has a contact angle of 50° or more between pure water and the surface when exposed to ultraviolet light including a wavelength of 180 nm or more and 370 nm or less for 15 minutes, and the metal ink is arranged on the base material at at least a portion of a region sandwiched by the precursor layers.

21 Claims, 10 Drawing Sheets

(51) Int. Cl.
    *H05K 3/24*     (2006.01)
    *H05K 3/12*     (2006.01)
    *B29C 59/02*     (2006.01)
    *G03F 7/20*     (2006.01)
    *H01L 21/288*     (2006.01)
    *H01L 21/3205*     (2006.01)
    *H01L 21/768*     (2006.01)

(52) U.S. Cl.
    CPC ........... *H05K 3/1258* (2013.01); *H05K 3/246* (2013.01); *H01L 21/288* (2013.01); *H01L 21/32051* (2013.01); *H01L 21/76838* (2013.01); *H05K 3/125* (2013.01); *H05K 2203/0108* (2013.01); *H05K 2203/1173* (2013.01); *H05K 2203/122* (2013.01); *Y10T 428/24355* (2015.01)

(58) Field of Classification Search
    USPC ...................................................... 428/195.1
    See application file for complete search history.

(56) References Cited

U.S. PATENT DOCUMENTS

| | | | |
|---|---|---|---|
| 2007/0231542 A1* | 10/2007 | Deng | ................... B08B 17/065 428/141 |
| 2011/0300351 A1* | 12/2011 | Suur-Nuuja | ........... D21H 17/57 428/204 |
| 2013/0020643 A1 | 1/2013 | Price | |
| 2014/0211297 A1 | 7/2014 | Kobashi et al. | |
| 2015/0017409 A1 | 1/2015 | Naito et al. | |
| 2016/0181098 A1 | 6/2016 | Inoue | |
| 2019/0041744 A1* | 2/2019 | Inoue | ................... G03F 7/0002 |

FOREIGN PATENT DOCUMENTS

| | | | |
|---|---|---|---|
| JP | 200948163 A | 5/2009 | |
| JP | 2010106286 A | 5/2010 | |
| JP | 2014209516 A | 6/2014 | |
| TW | 201343271 A | 11/2013 | |
| WO | 2004/042797 A2 | 5/2004 | |
| WO | 20130473360 A1 | 4/2013 | |
| WO | 2015/093455 A1 | 12/2014 | |
| WO | 2015/019771 A1 | 2/2015 | |

OTHER PUBLICATIONS

"English Translation of Taiwan IPO Examination Report", Taiwan Patent Office, for Taiwan Application No. 105126191, Aug. 29, 2019, 3pp.

Taiwan IPO Examination Report, Taiwan Patent Office, for Taiwan Application No. 105126191, Aug. 29, 2019, 4pp.

Communication: "Extended European Search Report", European Patent Office, for European Application No. 16846100.2-1107 / 3352202, PCT/JP2016/071387 dated Dec. 6, 2018 (Dec. 6, 2018), 6pp.

* cited by examiner

[Fig. 1]
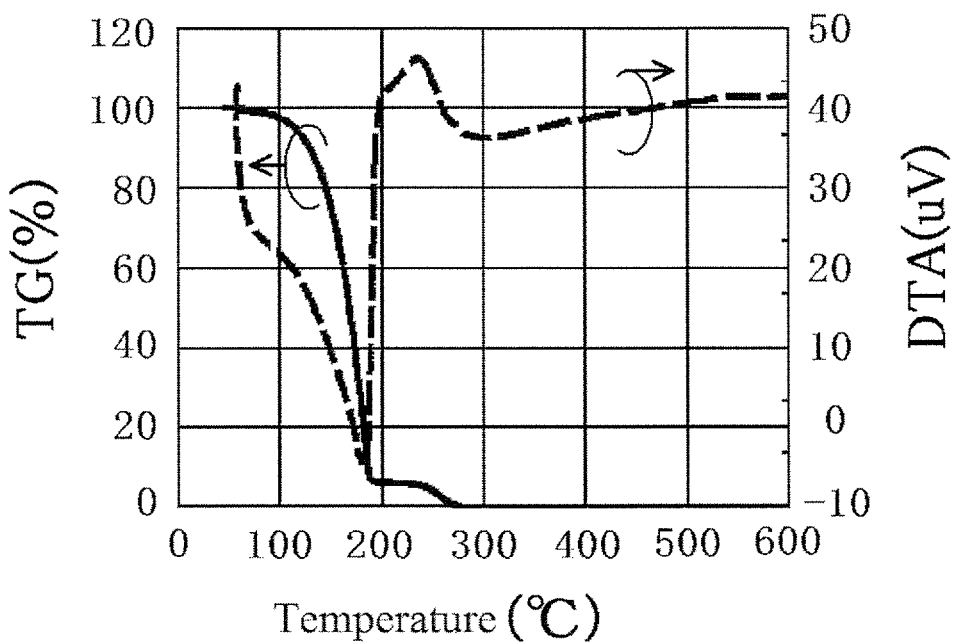
[Fig. 2]
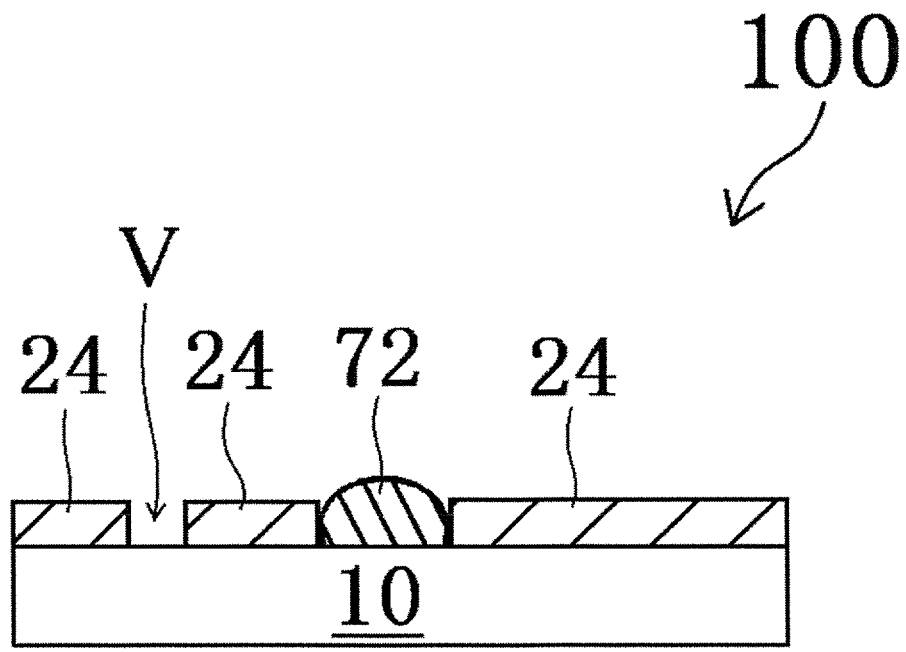

[Fig. 3]
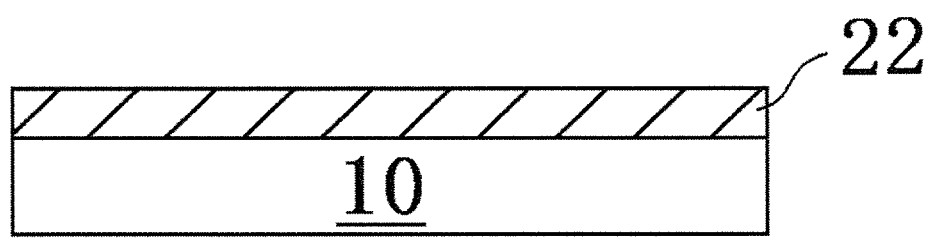
[Fig. 4]
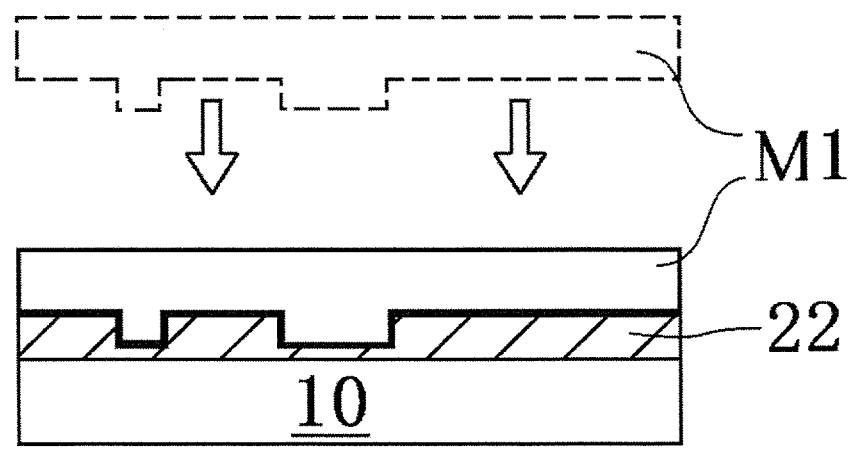

[Fig. 5]
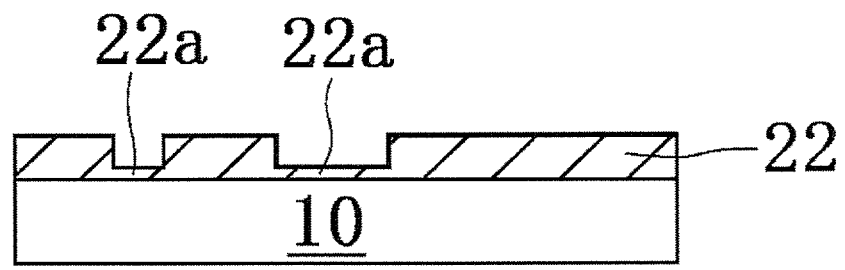
[Fig. 6]
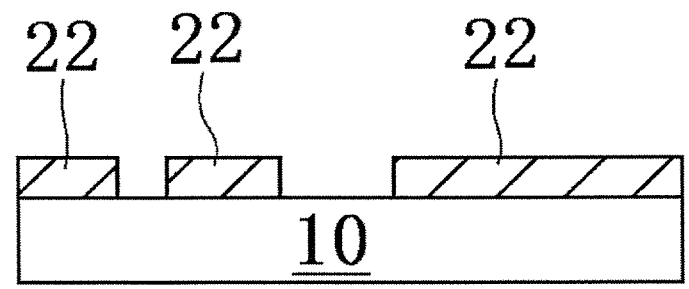

[Fig. 7]
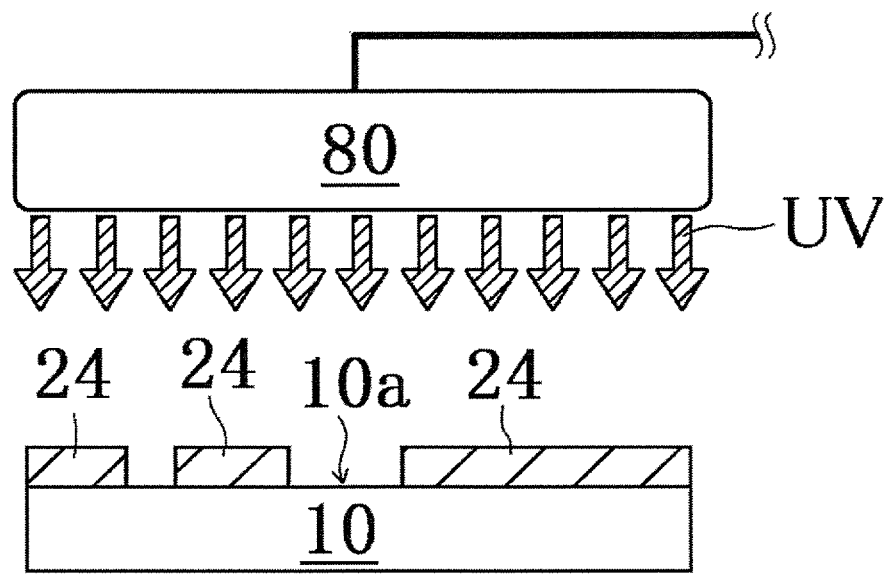
[Fig. 8]
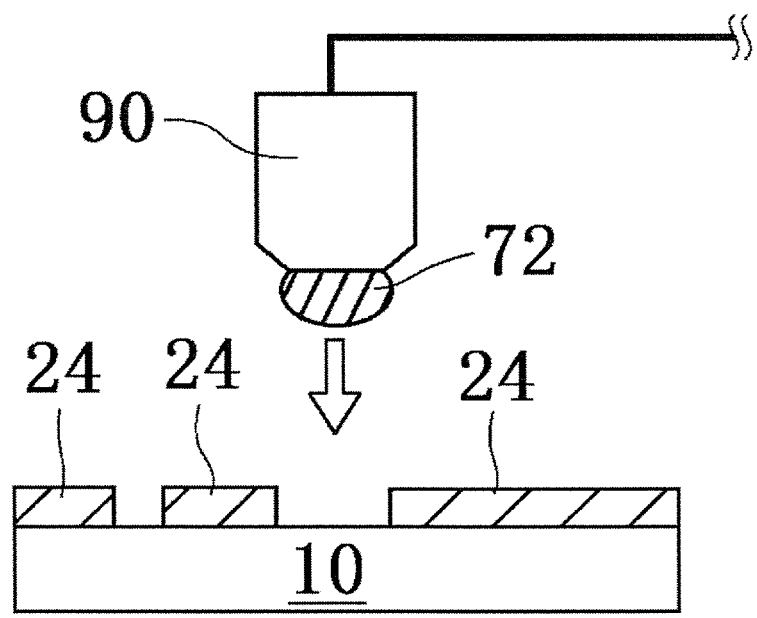

[Fig. 9]
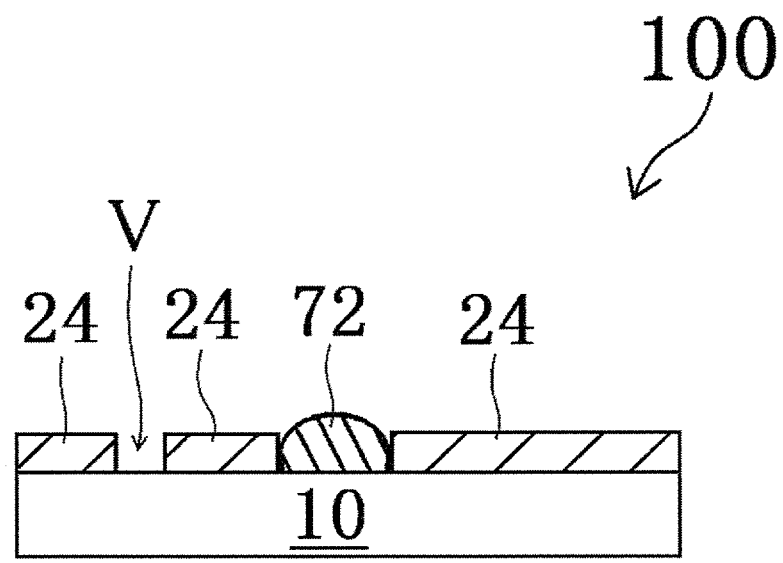
[Fig. 10]
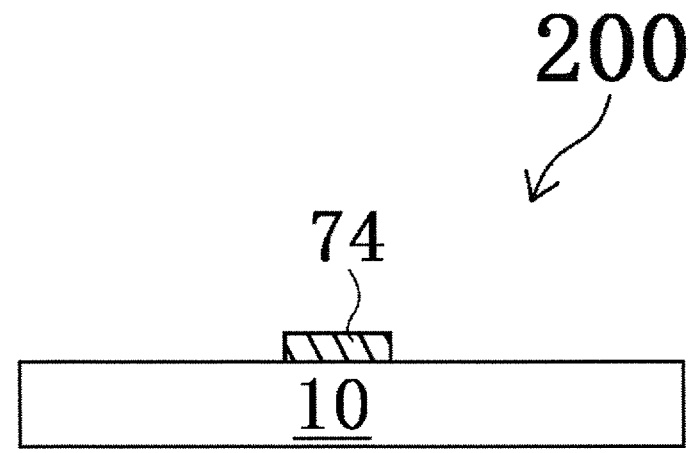

[Fig. 11]
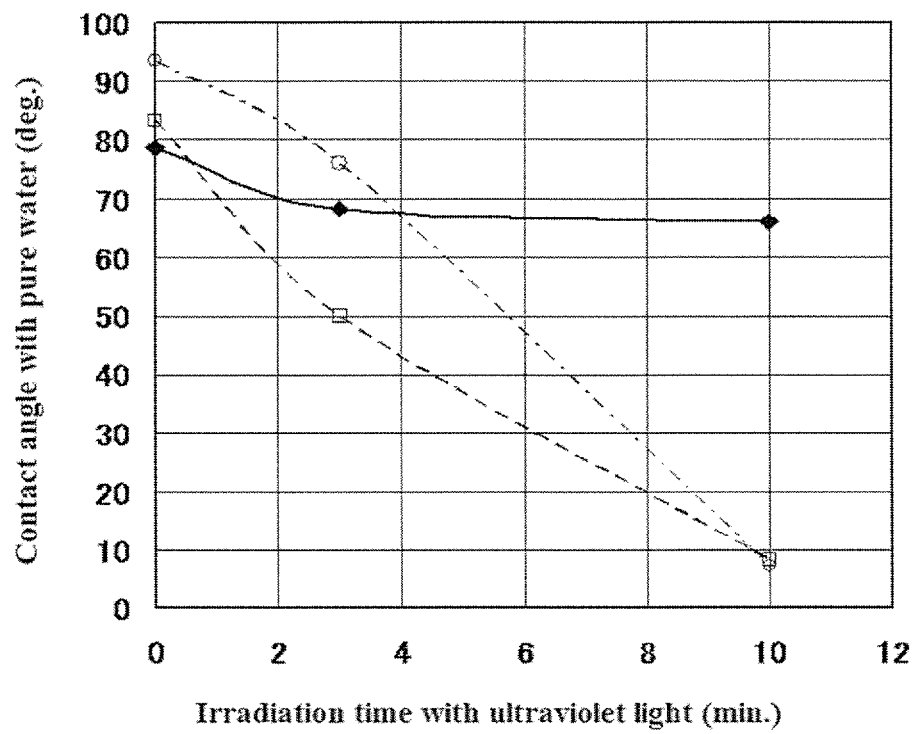
[Fig. 12]
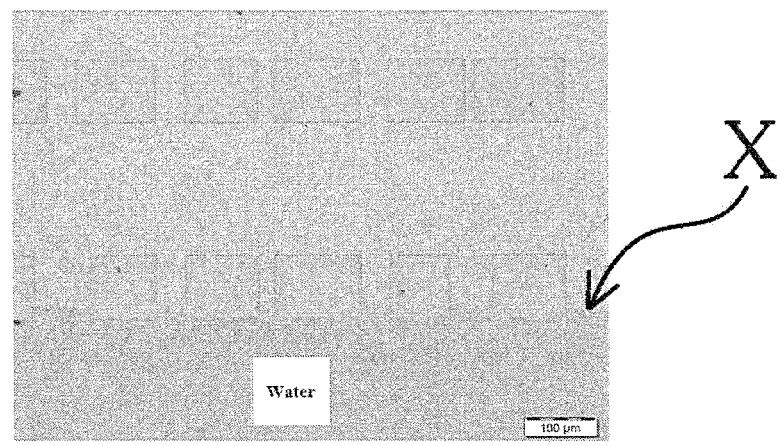

[Fig. 13]
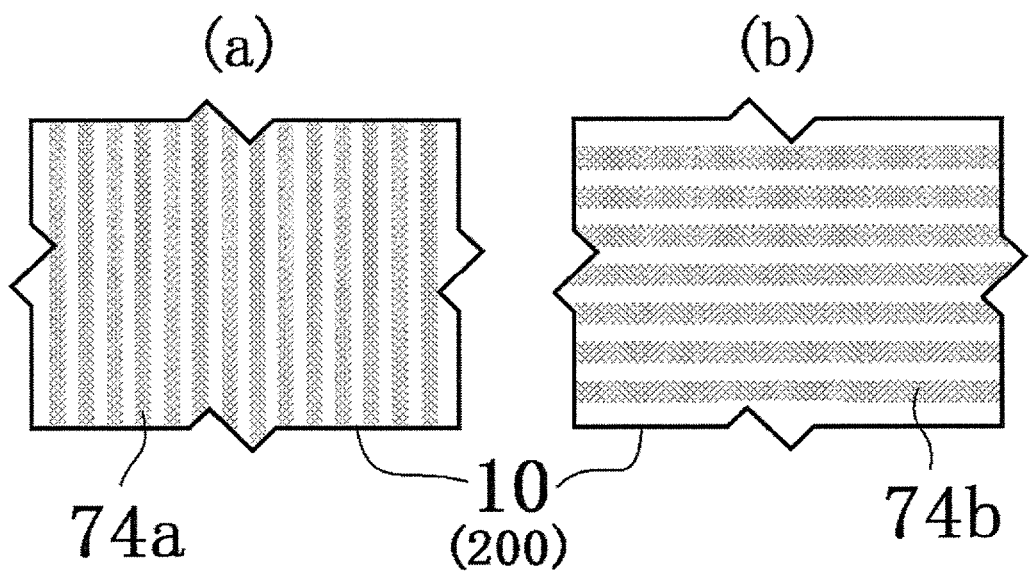
[Fig. 14]
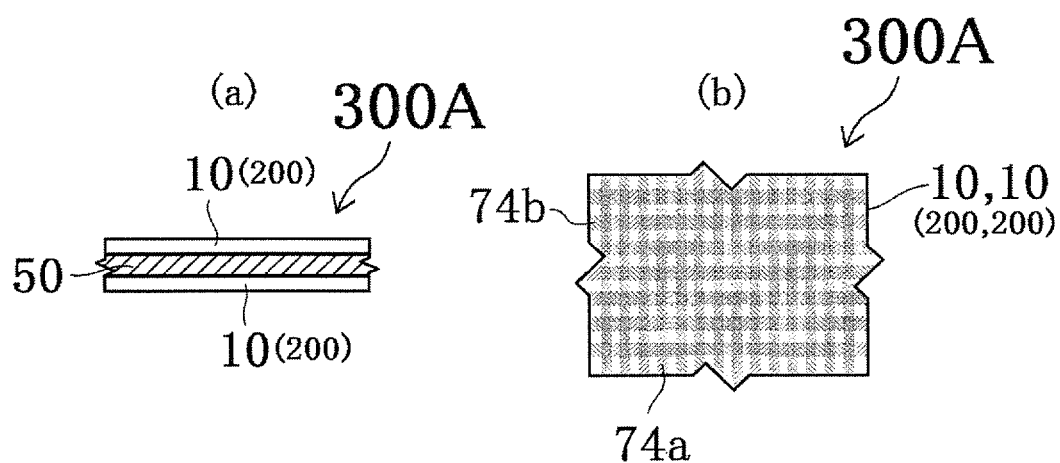

[Fig. 15]
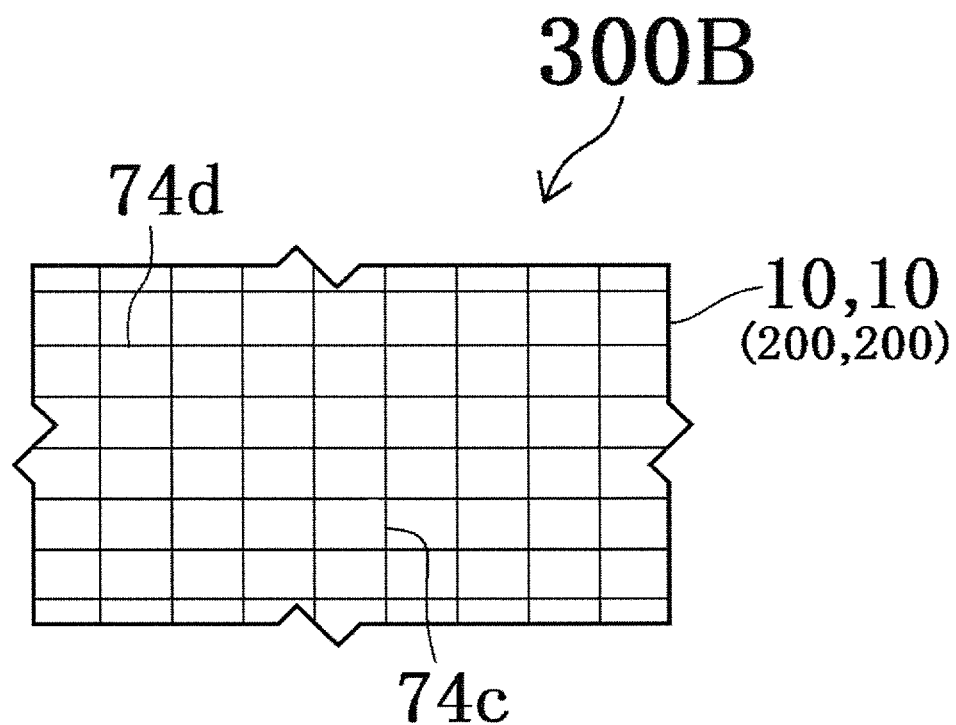
[Fig. 16]
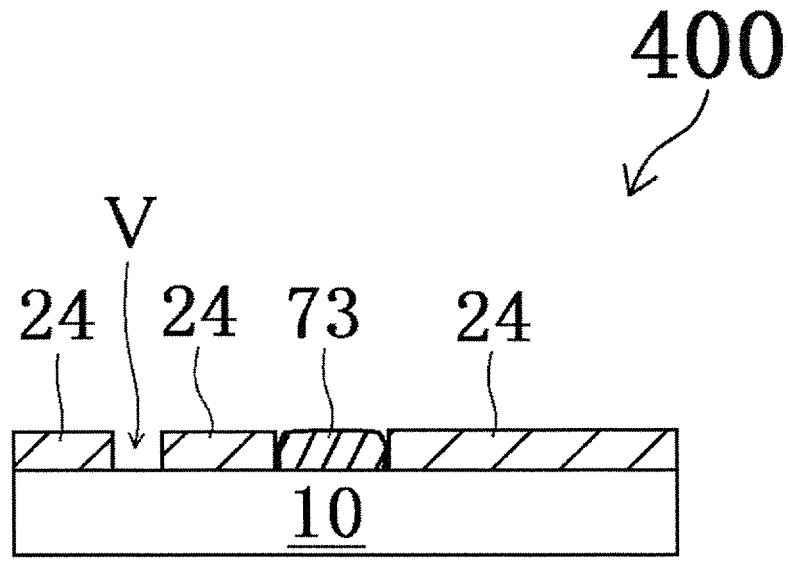

[Fig. 17]
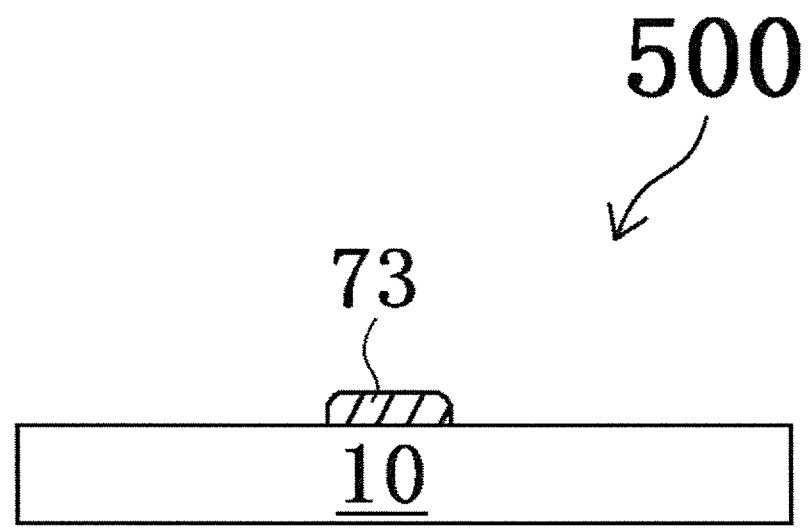
[Fig. 18]
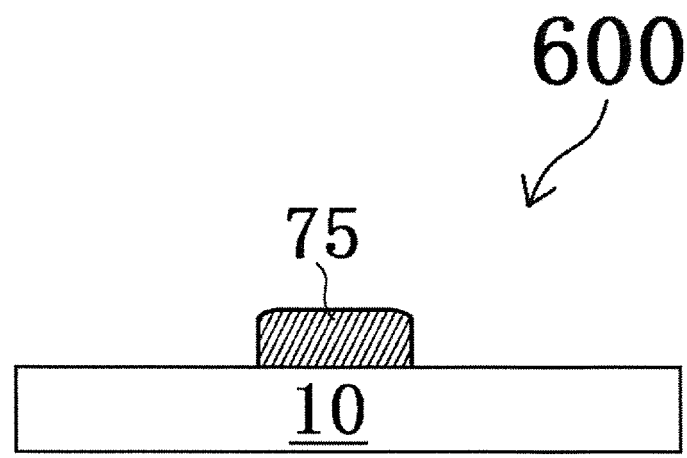

[Fig. 19]
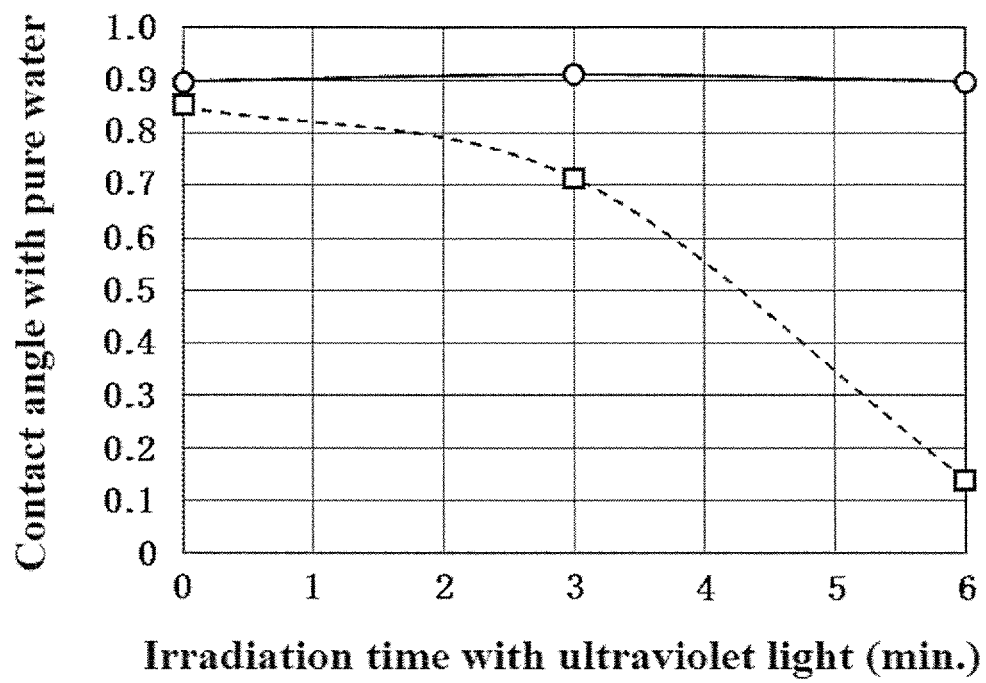

COMPOSITE MEMBER AND METHOD OF MANUFACTURING THE SAME, AND ALIPHATIC POLYCARBONATE-CONTAINING LAYER

This application is a U.S. National Stage filing under 35 U.S.C. § 371 and 35 U.S.C § 119, based on and claiming priority to PCT/JP2016/071387, filed Jul. 21, 2016, JP Patent Application No. 2015-221926, filed Nov. 12, 2015 and JP Patent Application No. 2015-185569 filed Sep. 18, 2015.

TECHNICAL FIELD

The present invention relates to a composite member and a method of manufacturing the composite member, and also relates to an aliphatic polycarbonate-containing layer.

BACKGROUND ART

As a method of forming wiring for various microelectronic devices, processes such as the sputtering method as one of the vacuum processes have been used for a long time, which require a relatively long period of time and/or expensive equipment. As an alternative method for forming electrically conductive wiring, there exists a so-called ink-jet printing method in which a metal ink is used. A recent prior art document discloses an ink for an ink-jet printer capable of forming electrically conductive wiring having low specific resistance at low temperature (for example, at 160° C.) in a short time by the ink-jet printing method, a method of manufacturing electrically conductive wiring with the above ink, and the electrically conductive wiring (Patent Document 1).

Further, focusing on the above wiring formation technology under conditions of low temperature, an attempt has also been made for forming an electronic device on a flexible resin substrate. Meanwhile, although unrelated to wiring formation for various microelectronic devices, the present inventors disclose a method of manufacturing an oxide semiconductor layer, the method including a precursor layer forming step of forming an oxide semiconductor precursor on or above a substrate to form a layer, the oxide semiconductor precursor having a compound of a metal to be oxidized into an oxide semiconductor dispersed in a solution containing a binder (which may include inevitable impurities) consisting of aliphatic polycarbonate; and an annealing step of heating the precursor layer to a first temperature at which 90 wt % or more of the binder is decomposed, and then annealing the precursor layer at a temperature higher than the first temperature and equal to or higher than a second temperature at which the metal binds to oxygen, and an exothermic peak is observed as determined by differential thermal analysis (DTA) of the precursor (Patent Document 2).

Patent Document 1: JP Patent Publication (Kokai) No. 2011-042758A

Patent Document 2: JP Patent No. 5749411

SUMMARY OF THE INVENTION

Problems to be Solved by the Invention

However, in order to form a pattern of wiring thereof, high-cost and highly complicated steps or equipment environments are usually required as exemplified by the photolithographic method. Further, a separate step is required for removing an unwanted film (a film only required for forming the pattern) other than the wiring after formation of the pattern. This adds an extra cost and may decrease yields of various final products such as electronic devices.

It is noted that use of a conventional process requiring a relatively long period of time and/or expensive equipment, such as the vacuum process and the photolithographic method described above, may result in decreased or deteriorated efficiency of usage of raw materials and manufacturing energy. Therefore, use of such a process is not preferred in terms of industrial properties or mass productivity.

Further, in order to reliably form a pattern of metal wiring, the metal wiring being formed using a metal ink as a starting material, so-called liquid repellency against the metal ink is required for a film for forming the pattern. However, it is very difficult to maintain the liquid repellency for a time long enough to complete a number of steps required to form the wiring.

Meanwhile, in order to form wiring with a metal ink, high affinity, in other words, high wettability is required between the metal ink itself and an underlying layer or a parent material. Therefore, simultaneous achievement and prolonged maintenance of the liquid repellency against a metal ink of a film for forming a pattern of the wiring and the aforementioned wettability may be one of the key elemental technologies for reliably forming wiring with the metal ink.

Solutions to the Problems

The present invention provides a composite member and a method of manufacturing the composite member, and an aliphatic polycarbonate-containing layer, which can contribute to simple formation and/or increased quality of fine wiring, in particular, which can significantly contribute to simple formation and/or increased quality of fine wiring from a metal ink.

The present inventors conducted extensive studies and analyses to find a simpler and more reliable method for forming a pattern of a metal layer by the so-called ink-jet printing method using a metal ink, as compared with the conventional method. As a result, the present inventors found that emitting ultraviolet light to at least a surface of a base material on which the metal layer is to be formed can improve properties of the base material (for example, the wettability with an metal ink), while emitting ultraviolet light to a conventional sacrifice layer provided for forming a pattern of the metal layer, rather, weakens the liquid repellency of the sacrifice layer.

Therefore, the present inventors conducted extensive studies to find a material with which the liquid repellency of a sacrifice layer is not deteriorated or decreased by irradiation with ultraviolet light. As a result, the present inventors found a special material with which almost no deterioration of the liquid repellency of a sacrifice layer is observed for a certain period of time even when the sacrifice layer is irradiated with ultraviolet light, and the sacrifice layer can be decomposed or removed reliably, in other words, leaving substantially no residue, by a very simple method such as heating when a pattern of a metal ink is formed on a base material, and then the metal ink is heated to form a metal layer. Further, the present inventors found that, by focusing on that special material, the aforementioned material or finding can also be effectively applied to a metal layer formed with a means different from the metal ink.

Furthermore, as a result of extensive studies and analyses, the present inventors found that the above pattern can be formed by a so-called nano-imprinting method (may also be referred to as the "imprinting method"; the same shall apply hereinafter). Consequently, the present inventors also found that steps from the formation of the above pattern through the formation of the metal layer can all be performed without using the so-called vacuum process, which is a process performed under vacuum or reduced pressure. The present invention is made based on each of the above points of view and extensive analyses.

It is noted that the term "process from the liquid state to the gel state" as used herein typically refers to, for example, a state in which a solvent is removed to some extent (without limitation, typically 80% or more by the mass ratio relative to the entire solvent) by heat treatment, but aliphatic polycarbonate is not substantially decomposed or removed.

A composite member according to one embodiment of the present invention includes a base material, an aliphatic polycarbonate-containing layer with multiple island-shaped portions arranged on the base material, and a metal ink. In the composite member, at least a surface of the aliphatic polycarbonate-containing layer has a contact angle of 50° or more between pure water and the surface when exposed to ultraviolet light including a wavelength from 180 nm or more to 370 nm or less for 15 minutes, and the metal ink is arranged on the base material at at least a portion of a region sandwiched between the respective island-shaped portions of the aliphatic polycarbonate-containing layer.

According to the above composite member, the aliphatic polycarbonate-containing layer can maintain high water repellency even when the aliphatic polycarbonate-containing layer is exposed to the aforementioned ultraviolet light. This enables the metal ink to be accurately arranged at a desired position in a region sandwiched between the respective island-shaped portions of the aliphatic polycarbonate-containing layer, leading to improved pattern accuracy of a subsequent metal layer. In addition, according to the above composite member, by performing heat treatment to convert the metal ink arranged at a region sandwiched between the respective island-shaped portions of the aliphatic polycarbonate-containing layer into a metal layer, the aliphatic polycarbonate will be decomposed or removed as a solvent component of the aliphatic polycarbonate-containing layer disappears. As a result, when the metal ink on the base material is heated so as to be converted into a metal layer, the aliphatic polycarbonate included therein can be decomposed or removed by a very simple method, leaving substantially no residue. Therefore, it can significantly contribute to simple formation and/or increased quality of fine wiring with a metal ink.

A composite member according to another embodiment of the present invention includes a base material, an aliphatic polycarbonate-containing layer with multiple island-shaped portions arranged on the base material, and a starting material layer for a metal plated layer. In the composite member, at least a surface of the aliphatic polycarbonate-containing layer has a contact angle of 50° or more between pure water and the surface when exposed to ultraviolet light including a wavelength from 180 nm or more to 370 nm or less for 15 minutes, and the starting material layer is arranged on the base material at at least a portion of a region sandwiched between the respective island-shaped portions of the aliphatic polycarbonate-containing layer.

According to the above composite member, the aliphatic polycarbonate-containing layer can maintain high water repellency even when the aliphatic polycarbonate-containing layer is exposed to the aforementioned ultraviolet light. This enables the starting material layer for a metal plated layer to be accurately arranged at a desired position in a region sandwiched between the respective island-shaped portions of the aliphatic polycarbonate-containing layer, leading to improved pattern accuracy of a subsequent starting material layer for a metal plated layer. In addition, according to the above composite member, by performing heat treatment, the aliphatic polycarbonate will be decomposed or removed as a solvent component of the aliphatic polycarbonate-containing layer disappears. As a result, the aliphatic polycarbonate can be decomposed or removed by a very simple method, leaving substantially no residue. Therefore, it can significantly contribute to simple formation and/or increased quality of fine wiring with a starting material layer for a metal plated layer.

Moreover, an aliphatic polycarbonate-containing layer according to one embodiment of the present invention includes multiple island-shaped portions. In the aliphatic polycarbonate-containing layer, at least a surface of the aliphatic polycarbonate-containing layer has a contact angle of 50° or more between pure water and the surface when exposed to ultraviolet light including a wavelength from 180 nm or more to 370 nm or less for 15 minutes.

According to the above aliphatic polycarbonate-containing layer, the aliphatic polycarbonate-containing layer can maintain high water repellency even when the aliphatic polycarbonate-containing layer is exposed to the aforementioned ultraviolet light. As a result, a metal ink can be accurately arranged at a desired position, leading to improved pattern accuracy of a subsequent metal layer, for example, in a case where the metal ink is arranged at a region sandwiched by the respective island-shaped portions of the aliphatic polycarbonate-containing layer. Moreover, according to the above aliphatic polycarbonate-containing layer, the aliphatic polycarbonate included therein will be decomposed or removed as the solvent component of the aliphatic polycarbonate-containing layer disappears, for example, in a case where heat treatment is performed to convert the metal ink arranged at a region sandwiched by the respective island-shaped portions of the aliphatic polycarbonate-containing layer into a metal layer. As a result, when the metal ink on the base material is heated so as to be converted into a metal layer, the aliphatic polycarbonate included therein can be decomposed or removed by a very simple method, leaving substantially no residue. This can significantly contribute to simple formation and/or increased quality of fine wiring with a metal ink. It is noted that arrangement of a metal ink on a base material is merely one example.

Further, a method of manufacturing a composite member according to one embodiment of the present invention includes: an ultraviolet light emitting step of emitting ultraviolet light including a wavelength of 180 nm or more and 370 nm or less to at least a surface of an aliphatic polycarbonate-containing layer with multiple island-shaped portions arranged on a base material and at least a surface of the base material; and an arrangement step of, after the ultraviolet light emitting step, arranging a metal ink on the base material at at least a portion of a region sandwiched by the respective island-shaped portions of the aliphatic polycarbonate-containing layer.

According to the above method of manufacturing a composite member, a composite member can be manufactured in which the aliphatic polycarbonate-containing layer can maintain high water repellency even when the ultraviolet light emitting step of emitting the aforementioned ultraviolet light to the aliphatic polycarbonate-containing layer is performed. This enables the metal ink to be accurately arranged at a desired position in a region sandwiched by the respective island-shaped portions of the aliphatic polycarbonate-containing layer in the arrangement step of arranging a metal ink, leading to improved pattern accuracy of a subsequent metal layer. In addition, according to the above method of manufacture a composite member, in a case where a heating step is subsequently performed to convert the metal ink arranged at a region sandwiched by the respective island-shaped portions of the aliphatic polycarbonate-containing layer into a metal layer, the aliphatic polycarbonate included therein will be decomposed or removed as the solvent component of the aliphatic polycarbonate-containing layer disappears. As a result, when the metal ink on the base material is heated so as to be converted into a metal layer, the aliphatic polycarbonate included therein can be decomposed or removed by a very simple method, leaving substantially no residue. Therefore, it can significantly contribute to simple formation and/or increased quality of fine wiring with a metal ink.

Further, a method of manufacturing a composite member according to another embodiment of the present invention includes: an ultraviolet light emitting step of emitting ultraviolet light including a wavelength of 180 nm or more and 370 nm or less to at least a surface of an aliphatic polycarbonate-containing layer with multiple island-shaped portions arranged on a base material and at least a surface of the base material; and an arrangement step of, after the ultraviolet light emitting step, arranging a starting material layer for a metal plated layer on the base material at at least a portion of a region sandwiched by the respective island-shaped portions of the aliphatic polycarbonate-containing layer.

According to the above method of manufacturing a composite member, a composite member can be manufactured in which the aliphatic polycarbonate-containing layer can maintain high water repellency even when the ultraviolet light emitting step of emitting the aforementioned ultraviolet light to the aliphatic polycarbonate-containing layer is performed. This enables the metal ink to be accurately arranged at a desired position in a region sandwiched by the respective island-shaped portions of the aliphatic polycarbonate-containing layer, leading to improved pattern accuracy of a subsequent starting material layer for a metal plated layer. In addition, according to the above method of manufacturing a composite member, the aliphatic polycarbonate included therein will be decomposed or removed as the solvent component of the aliphatic polycarbonate-containing layer disappears in a case where a heating step is subsequently performed. As a result, the aliphatic polycarbonate included therein can be decomposed or removed by a very simple method, leaving substantially no residue. Therefore, it can significantly contribute to simple formation and/or increased quality of fine wiring with a starting material layer for a metal plate layer.

Moreover, a method of manufacturing a composite member according to another embodiment of the present invention includes: an ultraviolet light emitting step of emitting ultraviolet light including a wavelength of 180 nm or more and 370 nm or less to at least a surface of an aliphatic polycarbonate-containing layer with multiple island-shaped portions arranged on a base material and at least a surface of the base material; an arrangement step of, after the ultraviolet light emitting step, arranging a metal ink on the base material at at least a portion of a region sandwiched by the respective island-shaped portions of the aliphatic polycarbonate-containing layer; and a heating step of, after the arrangement step, heating the aliphatic polycarbonate-containing layer and the metal ink at or above a temperature where the aliphatic polycarbonate-containing layer is decomposed or removed, and a metal layer is formed from the metal ink.

According to the above method of manufacturing a composite member, a composite member can be manufactured in which the aliphatic polycarbonate-containing layer can maintain high water repellency even when the ultraviolet light emitting step of emitting the aforementioned ultraviolet light to the aliphatic polycarbonate-containing layer is performed. This enables the metal ink to be accurately arranged at a desired position in a region sandwiched by the respective island-shaped portions of the aliphatic polycarbonate-containing layer in the arrangement step of arranging a metal ink, leading to improved pattern accuracy of a subsequent metal layer. In addition, according to the above method of manufacture a composite member, the aliphatic polycarbonate included therein will be decomposed or removed as the solvent component of the aliphatic polycarbonate-containing layer disappears by performing the heating step to convert the metal ink arranged at a region sandwiched by the respective island-shaped portions of the aliphatic polycarbonate-containing layer into a metal layer. As a result, when the metal ink on the base material is heated so as to be converted into a metal layer, the aliphatic polycarbonate included therein can be decomposed or removed by a very simple method such as heating, leaving substantially no residue. Therefore, it can significantly contribute to simple formation and/or increased quality of fine wiring with a metal ink.

By the way, each of the aforementioned embodiments of the present invention can be applied to a wide variety of technical fields as already described in part. Therefore, there is no particular limitation for the use thereof. For example, one advantage of using a pattern of aliphatic polycarbonate is that markedly high general versatility can be obtained as compared with a conductor layer (for example, a metal layer) formed with a pattern of a known resist layer. This is because the following disadvantages may occur when a pattern of a known resist layer is used instead of a pattern formed with an aliphatic polycarbonate-containing layer.

Specifically, when a pattern of a known resist layer is used, the resist layer, in particular, a surface thereof may usually undergo deterioration (for example, deterioration due to ultraviolet light) during the processes of manufacturing various devices having fine wiring (for example, semiconductor devices). If that is the case, a removal step is required by using plasma ($O_2$ plasma, Ar plasma, and the like) treatment and/or a so-called resist stripping liquid. However, if a material with low resistance to the stripping liquid or plasma (for example, an organic semiconductor material) is arranged on the same base material as the resist layer is provided, the material with low resistance may be affected in a negative way. Therefore, when a pattern of an aliphatic polycarbonate-containing layer is used, the aliphatic polycarbonate-containing layer can be decomposed or removed in a very simple and reliable manner by heat treatment alone at a relatively low temperature without using the aforementioned plasma or stripping liquid. Therefore, it is worth noting that a very versatile technology is provided in which deterioration of materials of layers provided on a base material is prevented by forming a pattern of an aliphatic polycarbonate-containing layer.

Further, the term "composite member" as used in the present application refers to a concept including not only a member including a base material, an aliphatic polycarbonate-containing layer arranged on the base material, and a metal ink but also a member including a base material, an aliphatic polycarbonate-containing layer arranged on the base material, and a starting material layer for a metal plated layer and a member including a base material and a metal layer formed using a metal ink arranged on the base material as a starting material. Moreover, the term "layer" as used in the present application refers to a concept including not only a layer but also a film. Conversely speaking, the term "film" as used in the present application refers to a concept including not only a film but also a layer.

In addition, the term "base material" as used in the present application is not limited to a plate-shaped base, but encompasses bases or parent materials in other forms (for example, a curved form). In addition, in each of the embodiments according to the present application described below, the term "applying" means that a layer is formed on a certain base material by a low-energy manufacturing process, for example, the printing method, the spin coating method, the bar coating method, or the slit coating method. Moreover, the term "metal ink" as used in the present application is not limited to an aspect where it is a liquid at ordinary temperature (typically 0° C. to 40° C.), but encompasses other aspects, for example, an aspect where a metal ink in the liquid state has been subjected to preliminary annealing (or has been dried) (that is, it is not completely solidified, but is in a highly viscous state), or an aspect where it is solidified after heating (or after annealing) as described below (that is, it has already formed a metal layer).

Effects of the Invention

In the composite member according to one embodiment of the present invention, provision of an aliphatic polycarbonate-containing layer capable of maintaining high water repellency even when exposed to ultraviolet light can lead to improved pattern accuracy of a subsequent metal layer. Further, according to the above composite member, the aliphatic polycarbonate included therein will be decomposed or removed as the solvent component of the aliphatic polycarbonate-containing layer disappears by performing heat treatment to convert a metal ink into a metal layer. As a result, it can contribute to simple formation and/or increased quality of fine wiring with a metal ink.

Further, in the composite member according to another embodiment of the present invention, the aliphatic polycarbonate included therein will be decomposed or removed as the solvent component of the aliphatic polycarbonate-containing layer disappears by performing heat treatment. As a result, the aliphatic polycarbonate included therein can be decomposed or removed by a very simple method, leaving substantially no residue. Therefore, it can significantly contribute to simple formation and/or increased quality of fine wiring with a starting material layer for a metal plated layer.

Further, in the aliphatic polycarbonate-containing layer according to one embodiment of the present invention, the aliphatic polycarbonate-containing layer can maintain high water repellency even when the aliphatic polycarbonate-containing layer is exposed to the aforementioned ultraviolet light. Moreover, according to the above aliphatic polycarbonate-containing layer, the aliphatic polycarbonate included therein can be decomposed or removed, leaving substantially no residue, for example, in a case where heat treatment is performed to convert a metal ink arranged at a region sandwiched by the respective island-shaped portions of the aliphatic polycarbonate-containing layer into a metal layer.

Further, in the method of manufacturing a composite member according to one embodiment of the present invention, provision of the aliphatic polycarbonate-containing layer capable of maintaining high water repellency even when exposed to ultraviolet light enables a metal ink to be accurately arranged at a desired position in a region sandwiched by the respective island-shaped portions of the aliphatic polycarbonate-containing layer. As a result, it leads to improved pattern accuracy of a subsequent metal layer.

Further, in the method of manufacturing a composite member according to another embodiment of the present invention, the aliphatic polycarbonate included therein will be decomposed or removed as the solvent component of the aliphatic polycarbonate-containing layer disappears in a case where the heating step is subsequently performed. As a result, the aliphatic polycarbonate included therein can be decomposed or removed by a very simple method, leaving substantially no residue. Therefore, it can significantly contribute to simple formation and/or increased quality of fine wiring with a starting material layer for a metal plated layer.

Further, in the method of manufacturing a composite member according to another embodiment of the present invention, provision of the aliphatic polycarbonate-containing layer capable of maintaining high water repellency even when exposed to ultraviolet light enables a metal ink to be accurately arranged at a desired position in a region sandwiched by the respective island-shaped portions of the aliphatic polycarbonate-containing layer. As a result, it leads to improved pattern accuracy of a subsequent metal layer. Further, according to the above method of manufacturing a composite member, the aliphatic polycarbonate included therein will be decomposed or removed as the solvent component of the aliphatic polycarbonate-containing layer disappears by performing heat treatment to convert the metal ink into a metal layer. As a result, it can contribute to simple formation and/or increased quality of fine wiring with a metal ink.

BRIEF DESCRIPTION OF THE DRAWINGS

FIG. 1 is a graph showing an example of the TG-DTA properties of an aliphatic polycarbonate precursor according to a first embodiment of the present invention.

FIG. 2 shows a side view of the overall configuration of a composite member according to the first embodiment of the present invention.

FIG. 3 is a schematic sectional view showing a process in a method of manufacturing a composite member according to the first embodiment of the present invention.

FIG. 4 is a schematic sectional view showing a process in the method of manufacturing a composite member according to the first embodiment of the present invention.

FIG. 5 is a schematic sectional view showing a process in the method of manufacturing a composite member according to the first embodiment of the present invention.

FIG. 6 is a schematic sectional view showing a process in the method of manufacturing a composite member according to the first embodiment of the present invention.

FIG. 7 is a schematic sectional view showing a process in the method of manufacturing a composite member according to the first embodiment of the present invention.

FIG. 8 is a schematic sectional view showing a process in the method of manufacturing a composite member according to the first embodiment of the present invention.

FIG. 9 is a schematic sectional view showing a process in the method of manufacturing a composite member according to the first embodiment of the present invention.

FIG. 10 is a schematic sectional view showing a process in the method of manufacturing a composite member according to the first embodiment of the present invention.

FIG. 11 shows a graph where changes in water repellency are plotted against exposure time to ultraviolet light for the aliphatic polycarbonate-containing layer according to the first embodiment of the present invention and a layer from Comparative Example.

FIG. 12 shows a light microscope image of an example of the water repellent performance of the aliphatic polycarbonate-containing layer according to the first embodiment of the present invention exposed to ultraviolet light which is shown in FIG. 11 and Table 1.

FIG. 13 shows top views of portions of composite members according to other embodiments of the present invention.

FIG. 14 shows a side view (a) and a top view (b) of a portion of a composite member according to another embodiment of the present invention.

FIG. 15 shows a top view of a portion of a composite member according to another embodiment of the present invention.

FIG. 16 shows a side view of the overall configuration of a composite member according to another embodiment of the present invention.

FIG. 17 shows a side view of the overall configuration of a composite member according to another embodiment of the present invention.

FIG. 18 shows a side view of the overall configuration of a composite member according to another embodiment of the present invention.

FIG. 19 shows a graph where changes in water repellency are plotted against exposure time to ultraviolet light for the aliphatic polycarbonate-containing layer according to the first embodiment of the present invention and an aliphatic polycarbonate-containing layer from Comparative Example.

EMBODIMENTS OF THE INVENTION

Composite members, aliphatic polycarbonate-containing layer, and methods of manufacturing the composite members according to the embodiments of the present invention will be described in detail with reference to the accompanying drawings. It is noted that in this disclosure, common parts are denoted by the same reference numbers throughout the drawings unless otherwise stated. Further, components in the drawings used in the embodiments are not necessarily illustrated in accordance with relative scaling. Moreover, some of the reference numbers may be omitted for clarity of the drawings.

First Embodiment

1. A Composite Member and a Method of Manufacturing the Composite Member

The composite member according to this embodiment includes an aliphatic polycarbonate-containing layer with multiple island-shaped portions (which may contain inevitable impurities. The same shall apply hereinafter) arranged on a base material. First, the aliphatic polycarbonate-containing layer will be described.

(Aliphatic Polycarbonate Precursor and Aliphatic Polycarbonate-Containing Layer)

The term "aliphatic polycarbonate precursor" refers to a state where aliphatic polycarbonate is dissolved in a certain solvent (typically an organic solvent). Further, the term "aliphatic polycarbonate-containing layer" according to this embodiment refers to a layer in a state (typically a "gel state") where the aliphatic polycarbonate precursor is heated to remove the solvent to an extent such that the aliphatic polycarbonate precursor can be used for the nano-imprinting method or various printing methods (for example, the screen printing method).

The aliphatic polycarbonate precursor according to this embodiment mainly includes aliphatic polycarbonate, but may include a compound, composition, or material other than aliphatic polycarbonate. It is noted that there is no particular limitation for the lower limit of the content of aliphatic polycarbonate in the aliphatic polycarbonate precursor, but the mass ratio of aliphatic polycarbonate to the total amount of a solute is typically 80% or more. Further, there is no particular limitation for the upper limit of the content of aliphatic polycarbonate in the aliphatic polycarbonate precursor, but the mass ratio of aliphatic polycarbonate to the total amount of a solute is typically 100% or less. It is noted that after the aliphatic polycarbonate-containing layer with multiple island-shaped portions (typically, a pattern of the aliphatic polycarbonate-containing layer) formed by, for example, the nano-imprinting method or the screen printing method is used to arrange a metal ink at a region sandwiched by the respective island-shaped portions of the aliphatic polycarbonate-containing layer, the aliphatic polycarbonate-containing layer is a target to be decomposed or removed mainly in a heating step.

It is noted that typical examples of the aliphatic polycarbonate-containing layer with multiple island-shaped portions include an aliphatic polycarbonate-containing layer where a pattern such as the line and space pattern or the dot pattern is formed which may be used in the nano-imprinting field or the semiconductor field, but the shape of a pattern which may be used in this embodiment is not limited to these. For example, aliphatic polycarbonate-containing layers having various known pattern shapes such as a winding aveguide, a hole, and a pillar may also be encompassed in the "aliphatic polycarbonate-containing layer with multiple island-shaped portions" according to this embodiment.

Further, with regard to the aliphatic polycarbonate-containing layer according to this embodiment, the exceptional utility and remarkable effects lie in the use of the aliphatic polycarbonate-containing layer itself as a material for arranging a metal ink. As described above, the metal ink can be converted into a metal layer, and at the same time the aliphatic polycarbonate-containing layer can be decomposed or removed very easily by heating at or above a temperature where the aliphatic polycarbonate-containing layer is decomposed or removed. This can significantly contribute to reduced steps in the method of manufacturing various devices such as semiconductor elements and electronic devices. Further, other compounds, compositions, or materials which may be decomposed or removed above a temperature where the aliphatic polycarbonate precursor (or the aliphatic polycarbonate-containing layer) is decomposed or removed are not preferably included in the aliphatic polycarbonate precursor in order to reliably decompose or remove the aliphatic polycarbonate-containing layer by heating at or above a temperature where the aliphatic polycarbonate-containing layer is decomposed or removed.

(Specific Examples of Aliphatic Polycarbonate and Aliphatic Polycarbonate-Containing Layer)

In this embodiment, endothermically decomposable aliphatic polycarbonate having good pyrolysability is used. It is noted that whether the thermal decomposition reaction of aliphatic polycarbonate is an endothermic reaction or not can be determined by the differential thermal analysis (DTA). Such aliphatic polycarbonate has a high oxygen content, and can be decomposed into low-molecular weight compounds at a relatively low temperature, and thus actively contributes to reduction of the amount of residual impurities in a metal oxide such as carbonous impurities.

Further, in this embodiment, there is no particular limitation for the organic solvent which can be used for the "aliphatic polycarbonate precursor" as a solution containing aliphatic polycarbonate, as long as it is an organic solvent in which aliphatic polycarbonate can be dissolved. Specific examples of the organic solvent include diethylene-glycol-monoethyl ether acetate (hereinafter, may also be referred to as "DEGMEA"), α-terpineol, β-terpineol, N-methyl-2-pyrrolidone, 2-nitropropane, isopropyl alcohol, diethylene-glycol-monobutyl ether acetate, diethylene glycol monobutyl ether, toluene, cyclohexane, methyl ethyl ketone, dimethyl carbonate, diethyl carbonate, propylene carbonate, and the like. Among these organic solvents, preferably used are diethylene-glycol-monoethyl ether acetate, α-terpineol, N-methyl-2-pyrrolidone, 2-nitropropane, and propylene carbonate in view of their suitably high boiling points and low vaporizability at room temperature.

Moreover, in this embodiment, after the aliphatic polycarbonate-containing layer with multiple island-shaped portions (typically, a pattern of the aliphatic polycarbonate-containing layer) formed by the nano-imprinting method or the screen printing method is used to arrange a metal ink at a region sandwiched by the respective island-shaped portions of the aliphatic polycarbonate-containing layer, the aliphatic polycarbonate-containing layer is a target to be eventually decomposed or removed as an unwanted material. Therefore, a solvent mixture of DEGMEA and 2-nitropropane is preferably used because a pattern is only required to persist for a relatively short time from pattern formation to decomposition or removal.

Moreover, a dispersing agent, a plasticizing agent, and the like can further be added, if desired, to the aliphatic polycarbonate precursor as a solution containing aliphatic polycarbonate.

Specific examples of the dispersing agent include:

polyhydric alcohol esters such as glycerin and sorbitan;

polyether polyols such as diethylene glycol, triethylene glycol, dipropylene glycol, tripropylene glycol, polyethylene glycol, and polypropylene glycol; amines such as polyethyleneimine;

(meth)acrylic resins such as polyacrylic acid and polymethacrylic acid;

copolymers of isobutylene or styrene with maleic anhydride, and amine salts thereof; and the like.

Specific examples of the plasticizing agent include polyether polyol, phthalate ester, and the like.

Further, there is no particular limitation for the method of forming the aliphatic polycarbonate-containing layer according to this embodiment. In one preferred aspect, the layer is formed by a low-energy manufacturing process. More specifically, a particularly simple method such as the screen printing method or the nano-imprinting method is preferably used to form the aliphatic polycarbonate-containing layer on a base material.

<TG-DTA (Thermogravimetry and Differential Thermal Analysis) Properties>

Here, the present inventors conducted more specific investigation about the process of decomposition and elimination of aliphatic polycarbonate which can be decomposed into low-molecular weight compounds at a relatively low temperature.

FIG. 1 is a graph showing an example of the TG-DTA properties of a solution (that is, the aliphatic polycarbonate precursor according to this embodiment) containing polypropylene carbonate as a solute. Polypropylene carbonate is a typical example of aliphatic polycarbonate. It is noted that this graph represents results obtained under ordinary pressure. Further, as shown in FIG. 1, the solid line in the figure represents measurement results from thermogravimetry (TG), and the dotted line in the figure represents measurement results from differential thermal analysis (DTA).

The results from thermogravimetry as shown in FIG. 1 indicated significant weight reduction from about 140° C. to about 190° C. due to decomposition or elimination of a portion of polypropylene carbonate itself as the solvent in the aliphatic polycarbonate precursor disappeared. It is noted that polypropylene carbonate appears to be converted into carbon dioxide and water in the above decomposition. Further, the results in FIG. 1 also showed that 90 wt % or more of aliphatic polycarbonate was decomposed and removed at around 190° C. More detailed analysis revealed that 95 wt % or more of aliphatic polycarbonate was decomposed at around 250° C., and almost all (99 wt % or more) of aliphatic polycarbonate was decomposed at around 260° C. Therefore, when the aliphatic polycarbonate precursor is used which can be substantially or mostly eliminated or removed by performing heat treatment at or above 250° C. (preferably at or above 260° C.), an aliphatic polycarbonate-containing layer formed from the aliphatic polycarbonate precursor and a precursor layer thereof can serve as a sacrifice layer for forming a metal layer according to this embodiment, in other words, will be decomposed or removed, leaving substantially no residue thereof.

It is noted that the above results were obtained when aliphatic polycarbonate was decomposed by relatively brief heat treatment. However, aliphatic polycarbonate was found to be sufficiently decomposed even at a lower temperature (for example, at 180° C.) when a longer heat treatment is performed. In other words, the lower temperature limit for decomposing or removing aliphatic polycarbonate by heating may typically be 180° C. However, this lower temperature limit means a temperature at which aliphatic polycarbonate is substantially or mostly decomposed to show mass reduction due to decomposition of aliphatic polycarbonate, but not a temperature at which only one or several bonds in aliphatic polycarbonate are broken. Therefore, the aliphatic polycarbonate-containing layer which can be substantially or mostly decomposed or removed when heated at or above 180° C. can serve as a sacrifice layer for forming a metal layer to be included in the composite member according to this embodiment, in other words, will be decomposed or removed leaving substantially no residue thereof.

It is worth noting that when heat treatment is performed at a temperature (typically at or above 180° C., preferably at or above 250° C., and more preferably at or above 260° C.) where the aliphatic polycarbonate-containing layer is decomposed or removed as described above, the aliphatic polycarbonate-containing layer can serve as a sacrifice layer for forming a metal layer to be included in the composite member according to this embodiment, in other words, will be decomposed or removed leaving substantially no residue thereof.

(Details of Aliphatic Polycarbonate)

It is noted that polypropylene carbonate is used as an example of aliphatic polycarbonate in this embodiment, but there is no particular limitation for the type of aliphatic polycarbonate used in this embodiment. For example, a type of aliphatic polycarbonate obtained by a polymerization reaction of epoxide and carbon dioxide may also be used suitably in this embodiment. When the aliphatic polycarbonate obtained by a polymerization reaction of epoxide and carbon dioxide is used, the structure of aliphatic polycarbonate can be controlled. This can effectively provide a type of aliphatic polycarbonate having a desired molecular weight and improved susceptibility to endothermic decomposition. In particular, aliphatic polycarbonate is preferably at least one selected from the group consisting of polyethylene carbonate, polypropylene carbonate, and polybutylene carbonate among types of aliphatic polycarbonate in view of the high content of oxygen and the susceptibility to decomposition into low-molecular weight compounds at a relatively low temperature. Further, aliphatic polycarbonate is preferably at least one selected from the group consisting of polypropylene carbonate and polybutylene carbonate in view of reliably preventing deterioration of the liquid repellency of an aliphatic polycarbonate layer as a sacrifice layer due to irradiation with ultraviolet light as described below.

The epoxide is not particularly limited if the epoxide undergoes a polymerization reaction with carbon dioxide to form aliphatic polycarbonate having a structure including aliphatic groups on the main chain. Adoptable examples of the epoxide in this embodiment include ethylene oxide, propylene oxide, 1-butene oxide, 2-butene oxide, isobutylene oxide, 1-pentene oxide, 2-pentene oxide, 1-hexene oxide, 1-octene oxide, 1-decene oxide, cyclopentene oxide, cyclohexene oxide, styrene oxide, vinylcyclohexene oxide, 3-phenylpropylene oxide, 3,3,3-trifluoropropylene oxide, 3-naphthylpropylene oxide, 3-phenoxypropylene oxide, 3-naphthoxypropylene oxide, butadiene monoxide, 3-vinyloxypropylene oxide, and 3-trimethylsilyloxypropylene oxide. Among these epoxides, ethylene oxide and propylene oxide are preferably used in terms of their high polymerization reactivity with carbon dioxide. These epoxides may each be used alone or may be used in combination of two or more thereof.

The mass-average molecular weight of the aforementioned aliphatic polycarbonate is preferably 5000 to 1000000, and more preferably 10000 to 600000. Aliphatic polycarbonate having a mass-average molecular weight of less than 5000 may not be suitable as a material, for example, for the nano-imprinting method or the screen printing method due to effects such as decreased viscosity and the like. Moreover, aliphatic polycarbonate having a mass-average molecular weight of more than 1000000 may not be suitable either as a material for the nano-imprinting method or the screen printing method due to decreased solubility of aliphatic polycarbonate into an organic solvent. It is noted that the above numerical values of mass-average molecular weight can be computed by the following method.

Specifically, a chloroform solution containing the aliphatic polycarbonate at a concentration of 0.5% by mass is prepared and measured using high performance liquid chromatography. After the measurement, the molecular weight is calculated by comparison with polystyrene having a known mass-average molecular weight measured under the identical conditions. The measurement conditions are as follows.

Type: HLC-8020 (Tosoh Corporation)
Column: GPC column (Trade name of Tosoh Corporation: TSK GEL Multipore HXL-M)
Column temperature: 40° C.
Eluent: chloroform
Flow speed: 1 mL/minute As an example of a production method of the aliphatic polycarbonate mentioned above, a method such as polymerization reaction between the epoxide and carbon dioxide in the presence of a metal catalyst is adoptable.

A production example of aliphatic polycarbonate is as follows.

The atmosphere of the system of an autoclave having a volume of 1 L and equipped with a stirrer, a gas introduction tube, and a thermometer was preliminarily replaced with an atmosphere of nitrogen, and was then charged with a reaction solution containing an organozinc catalyst, hexane, and propylene oxide. The atmosphere of the reaction system was then replaced with an atmosphere of carbon dioxide by adding carbon dioxide with stirring, and the autoclave was filled with carbon dioxide until the pressure of the reaction system reached about 1.5 MPa. The temperature of the autoclave was subsequently raised to 60° C. and polymerization reaction was carried out for several hours while supplying carbon dioxide to be consumed by the reaction. After completion of the reaction, the autoclave was cooled and depressurized and its content was filtrated. The filtrated product was then dried under reduced pressure to obtain polypropylene carbonate.

Specific examples of the metal catalyst include an aluminum catalyst and a zinc catalyst. Among these metal catalysts, the zinc catalyst is preferably used in terms of high polymerization activity in polymerization reaction between epoxide and carbon dioxide. An organozinc catalyst is particularly preferred among the zinc catalysts.

Specific examples of the organozinc catalyst include:
organozinc catalysts such as zinc acetate, diethyl zinc, and dibutyl zinc; and
organozinc catalysts obtained by reaction between a zinc compound and compounds such as primary amine, dihydric phenol, divalent aromatic carboxylic acid, aromatic hydroxy acid, aliphatic dicarboxylic acid, and aliphatic monocarboxylic acid.

According to a preferred aspect, an organozinc catalyst among these organozinc catalysts is adopted, which is obtained by reaction of a zinc compound with an aliphatic dicarboxylic acid and an aliphatic monocarboxylic acid, due to higher polymerization activity.

A production example of an organozinc catalyst is as follows.

A four-necked flask equipped with a stirrer, a nitrogen gas introduction tube, a thermometer, and a reflux condenser was charged with zinc oxide, glutaric acid, acetic acid, and toluene. After the atmosphere of the reaction system was replaced with an atmosphere of nitrogen, the temperature of the flask was raised to 55° C. and the materials were stirred at this temperature for 4 hours so as to perform reaction of the respective materials. The temperature of the flask was then raised to 110° C. and the materials were stirred at this temperature for 4 hours so as to cause azeotropic dehydration for removal of only water. The flask was then cooled to room temperature to obtain a reaction solution containing an organozinc catalyst. The organozinc catalyst, which was obtained by partially fractionating and filtrating the reaction solution, was subjected to IR measurement (Thermo Nicolet Japan Inc., trade name: AVATAR360). As a result, no peak based on carboxylic groups was confirmed.

The amount of the metal catalyst used for the polymerization reaction is preferably 0.001 to 20 parts by mass and more preferably 0.01 to 10 parts by mass with respect to 100 parts by mass of the epoxide. The polymerization reaction may be unlikely to progress if the amount of the used metal catalyst is less than 0.001 parts by mass. In contrast, if the amount of the used metal catalyst exceeds 20 parts by mass, effects in accord with the amount of use may not be obtained, which may be economically undesirable.

A reaction solvent to be used as necessary in the polymerization reaction is not particularly limited. Various types of organic solvent can be adopted as the reaction solvent. Specific examples of the organic solvent include:

aliphatic hydrocarbon solvents such as pentane, hexane, octane, decane, and cyclohexane;

aromatic hydrocarbon solvents such as benzene, toluene, and xylene;

halogenated hydrocarbon solvents such as chloromethane, methylene dichloride, chloroform, carbon tetrachloride, 1,1-dichloroethane, 1,2-dichloroethane, ethyl chloride, trichloroethane, 1-chloropropane, 2-chloropropane, 1-chlorobutane, 2-chlorobutane, 1-chloro-2-methylpropane, chlorobenzene, and bromobenzene; and carbonate solvents such as dimethyl carbonate, diethyl carbonate, and propylene carbonate.

The amount of the used reaction solvent is preferably 500 parts by mass or more and 10000 parts by mass or less with respect to 100 parts by mass of the epoxide in terms of smooth reaction.

The method of the reaction between an epoxide and carbon dioxide in the presence of a metal catalyst is not particularly limited in the polymerization reaction described above. For example, an adoptable method includes charging in an autoclave the epoxide, the metal catalyst, and a reaction solvent as necessary, mixing these components, and then injecting carbon dioxide under pressure for reaction.

The pressure under which the carbon dioxide is used in the polymerization reaction is not particularly limited. Typically, the pressure is preferably from 0.1 MPa to 20 MPa, more preferably from 0.1 MPa to 10 MPa, and even more preferably from 0.1 MPa to 5 MPa. If the carbon dioxide is used at a pressure exceeding 20 MPa, effects in accord with the amount of use may not be obtained, which may be economically undesirable.

The polymerization reaction temperature in the above polymerization reaction is not particularly limited. The typical polymerization reaction temperature is preferably from 30° C. to 100° C. and more preferably from 40° C. to 80° C. If the polymerization reaction temperature is lower than 30° C., the polymerization reaction may take a long period. In contrast, if the polymerization reaction temperature exceeds 100° C., side reaction may occur with a lower yield. The period of the polymerization reaction is typically preferred to be from 2 to 40 hours, although the period differs depending on the polymerization reaction temperature and cannot be determined generally.

After the completion of the polymerization reaction, the aliphatic polycarbonate may be obtained by filtration or the like, and washing with a solvent or the like as necessary, followed by drying.

(Composite Member)

In this embodiment, the aforementioned aliphatic polycarbonate-containing layer is formed on the entirety of a base material, and an imprinted structure is then formed by the nano-imprinting method. Subsequently, an aliphatic polycarbonate-containing layer with multiple island-shaped portions is formed by plasma treatment performed under atmospheric pressure. Further, a metal ink is then arranged at a region sandwiched by the respective island-shaped portions of the aliphatic polycarbonate-containing layer to manufacture a composite member. It is noted that the aliphatic polycarbonate-containing layer is decomposed or removed mainly at a heating step in the process where a metal layer is formed using the metal ink as a starting material. Below, detailed descriptions thereof are provided with reference to the accompanying drawings.

(Overall Configuration of Composite Member)

FIG. 2 shows a side view of the overall configuration of a composite member 100 in this embodiment. As shown in FIG. 2, the composite member 100 includes an aliphatic polycarbonate-containing layer 24 irradiated with ultraviolet light and a metal ink 72 on a base material 10. More specifically, the composite member 100 includes the metal ink 72 on the base material 10 at at least a portion of a region sandwiched by the respective island-shaped portions 24, 24, 24 of the aliphatic polycarbonate-containing layer with multiple island-shaped portions 24, 24, 24 arranged on the base material 10. A space indicated by "V" in FIG. 2 means that the metal ink is not arranged. Of course, in one aspect, the metal ink may also be arranged at the space indicated by "V." It is noted that there is no particular limitation for the material of the base material 10 in this embodiment, but various glass materials, silicon, other known insulators (including resin materials), or semiconductor materials can typically be used for the base material 10. Further, a composite member 200 includes a base material 10 and a metal layer 74 formed using a metal ink arranged on the base material 10 as a starting material. The composite member 200 will be described below. It is noted that examples of the base material 10 in this embodiment may include those on which a pattern of a conductor layer, a semiconductor layer, or an insulator layer is pre-formed on the base material 10. Therefore, one variation according to this embodiment is a composite member in which the aliphatic polycarbonate-containing layer with multiple island-shaped portions 24, 24, 24 according to this embodiment is formed on a conductor layer, a semiconductor layer, or an insulator layer.

(Method of Manufacturing Composite Member)

Next, the method of manufacturing the composite member 100 and the composite member 200 will be described with reference to FIG. 3 to FIG. 10.

In this embodiment, polypropylene carbonate as an example of the aliphatic polycarbonate-containing layer 22 is formed on glass or polyimide as the base material 10 by the known spin coating method or bar coating method as shown in FIG. 3. It is noted that there is no particular limitation for the thickness of the aliphatic polycarbonate-containing layer 22, but the typical thickness thereof is 300 nm or more and 1000 nm or less.

Next, performed is a step (a preliminary annealing step or drying step, which are hereinafter referred to as the "preliminary annealing step" collectively) of removing a solvent component included in the aliphatic polycarbonate-containing layer 22 by heating the aliphatic polycarbonate-containing layer 22 to an extent such that an imprinted structure can be formed subsequently by the nano-imprinting method. In this embodiment, heat treatment at 100° C. to 150° C. was performed as the preliminary annealing step.

Subsequently, an imprinting step of forming an imprinted structure on the aliphatic polycarbonate-containing layer 22 is performed by pressing a mold M1 against the aliphatic polycarbonate-containing layer 22 under a pressure of 0.1 MPa or more and 20 MPa or less as shown in FIG. 4. By this imprinting process, the thickness of a region 22a pressed with a protruded portion of the mold M1 becomes thin as compared with other regions as shown in FIG. 5.

In the nano-imprinting method according to this embodiment, the aliphatic polycarbonate-containing layer with multiple island-shaped portions 22 is subjected to the imprinting process while heated at 100° C. or more and 300° C. or less. It is noted that the aliphatic polycarbonate-containing layer 22 may remain without being completely decomposed while subjected to the imprinting process, in other words, under pressurized conditions. Further, the base material 10 is heated with a known heater, and further the mold M1 itself is also heated with a known heater during the imprinting process, for example, as in the technical idea disclosed in WO2013/069686. The temperatures of the base material 10 and the mold M1 are each appropriately adjusted during the imprinting process. An exemplary heating temperature of the base material 10 is 50° C. to 300° C., and an exemplary heating temperature of the mold M1 is 100° C. to 220° C. during the process.

Here, the pressure is controlled within the range of "0.1 MPa or more and 20 MPa or less" based on the following reasons. First, a pressure of less than 0.1 MPa may be too low to continue imprinting the aliphatic polycarbonate-containing layer 22. It is noted that when polypropylene carbonate, which is a relatively soft material, is used as aliphatic polycarbonate, the imprinting process can be performed under a pressure as low as about 0.1 MPa. On the other hand, a pressure of 20 MPa is enough for sufficient imprinting of the aliphatic polycarbonate-containing layer 22. A pressure equal to or higher than that is not necessary. According to the above points of view, the imprinting process is more preferably performed under a pressure in the range of 0.5 MPa or more and 10 MPa or less in the imprinting step of this embodiment.

Subsequently, etching treatment is performed to etch the entire surface of the aliphatic polycarbonate-containing layer 22 having an imprinted structure formed by the nanoimprinting method by exposure to plasma generated under an atmospheric pressure atmosphere. It is noted that the specific gases introduced into a treatment chamber to form the plasma used in this embodiment are oxygen, argon, and helium. Further, a high-frequency electric power of about 500 W is applied. In this embodiment, an atmospheric-pressure plasma instrument (Model YAP510S) from Yamato Scientific Co., Ltd. was used. As a result, the aliphatic polycarbonate-containing layer with multiple island-shaped portions 22, 22, 22 is formed as shown in FIG. 6.

It is noted that the aliphatic polycarbonate-containing layer with multiple island-shaped portions 22, 22, 22 can also be formed with the accessorial aid of etching treatment with oxygen plasma under reduced pressure in addition to the plasma generated under an atmospheric pressure atmosphere. However, use of an environment friendly and low-energy process is very advantageous in view of reduced production time and cost instead of using a process requiring a relativity long period of time and/or expensive equipment such as the vacuum (reduced pressure) process which has been conventionally used.

Further, very interestingly, when only the plasma generated under an atmospheric pressure atmosphere was used to form the aliphatic polycarbonate-containing layer with multiple island-shaped portions 22, 22, 22, a certain advantageous feature was able to be obtained. Specifically, it was shown that the contact angle with pure water as measured by a measurement method similar to that shown in FIG. 11 described below remained unchanged at least for a certain period of time, and a state of a large contact angle was maintained even after exposure to ultraviolet light. In contrast, when the aliphatic polycarbonate-containing layer with multiple island-shaped portions 22, 22, 22 was formed with the oxygen plasma under reduced pressure, the contact angle showed a significant decrease as the exposure time to ultraviolet light increased.

For reference, a graph is provided in FIG. 19 where changes in water repellency are plotted against the exposure time to ultraviolet light for the aliphatic polycarbonate-containing layer with multiple island-shaped portions according to this embodiment (circles and solid line in the figure) formed by using only the plasma generated under an atmospheric pressure atmosphere, and an aliphatic polycarbonate-containing layer with multiple island-shaped portions from Comparative Example (squares and dotted line in the figure) formed by using the oxygen plasma under reduced pressure. Note that the vertical axis is normalized for clarity. The figure thus demonstrates that formation of the aliphatic polycarbonate-containing layer with multiple island-shaped portions 22, 22, 22 by using only the plasma generated under an atmospheric pressure atmosphere is very effective for maintaining a high contact angle of the aliphatic polycarbonate-containing layer 22, 22, 22.

Here, for the shortest distance between the respective island-shaped portions 22, 22, 22 of the aliphatic polycarbonate-containing layer with multiple island-shaped portions 22, 22, 22 (in other words, the smallest space between the respective island-shaped portions 22, 22, 22), 500 nm or more and 20 μm or less can be achieved when at least a pattern forming method such as the imprinting method is used. Studies and analyses by the present inventors have revealed that a distance between the finest portions of the multiple island-shaped portions of the aliphatic polycarbonate-containing layer 22, 22, 22 of 500 nm at the shortest can be obtained, which satisfies the aforementioned numerical range, and can be considered as very fine microfabrication process.

It is noted that in this embodiment, the aliphatic polycarbonate-containing layer with multiple island-shaped portions 22, 22, 22 is formed by etching the entire surface of the aliphatic polycarbonate-containing layer 22 having an imprinted structure using plasma under atmospheric pressure. However, the method of forming the aliphatic polycarbonate-containing layer with multiple island-shaped portions 22, 22, 22 is not limited to the aforementioned method. For example, when the screen printing is used, the aliphatic polycarbonate-containing layer with multiple island-shaped portions 22, 22, 22 can already be formed upon applying the aliphatic polycarbonate-containing layer 22 on the base material 10.

Next, in this embodiment, an ultraviolet light emitting step is performed, the step including emitting ultraviolet light including a wavelength of 180 nm or more and 370 nm or less to both the aliphatic polycarbonate-containing layer with multiple island-shaped portions 22, 22, 22 and a surface 10a of the base material 10 where the aliphatic polycarbonate-containing layer 22 is not provided by using a known ultraviolet emitting device 80 (Model MHU-110WB, Multiply Co. Ltd.) as shown in FIG. 7. It is noted that other examples of the ultraviolet emitting device emitting ultraviolet light including a wavelength of 180 nm or more and 370 nm or less which may be used in this embodiment include an ultraviolet light lamp with the main wavelength of 365 nm (Model SLW-8, As One Corp.).

As a result, contaminants such as organic substances on the surface 10a adhering through the previous steps of this embodiment, contaminants such as organic substances on the surface 10a adhering over time through exposure to the air, and/or the like can be decomposed and/or removed by exposure to ultraviolet light. As a result, hydrophilicity can be reliably conferred on the surface 10a of the base material 10. Therefore, a high affinity between a metal ink and the base material 10, in other words, high wettability (hereafter, collectively referred to as "high wettability") can be obtained when the metal ink is subsequently arranged.

It is noted that examples of the base material 10 in this embodiment may include those having a pattern of a conductor layer, a semiconductor layer, or an insulator layer pre-formed on the base material 10 as also described above. Here, for example, when a parent material is a silicon substrate, and another layer (for example, a silicon oxide layer) is present between the surface of the parent material and the aliphatic polycarbonate-containing layer 22, high wettability of a surface of the "another layer" with a metal ink is required. If that is the case, the surface of the "another layer" is directly irradiated with the aforementioned ultraviolet light in the ultraviolet light emitting step. Therefore, the base material 10 in that case refers to an integrated body of the silicon substrate as a parent material and the "another layer" provided on the surface of the silicon substrate.

In addition, the aliphatic polycarbonate-containing layer 24 which has been irradiated with ultraviolet light in the ultraviolet light emitting step needs to maintain the high water repellency against a metal ink when the metal ink is subsequently arranged. The reason of this is as follows. If the aliphatic polycarbonate-containing layer 24 has high wettability with a metal ink, the metal ink may spread over a region (for example, a region of the upper surface of the aliphatic polycarbonate-containing layer 24 irradiated with ultraviolet light) different from a desired location (for example, a region indicated as the surface 10a in FIG. 7). This may result in a problem in that the dimensions of a metal layer to be formed using the metal ink as a starting material are not well controlled.

In contrast, studies and analyses by the present inventors revealed that in this embodiment, high water repellency can be maintained even after exposure to the above ultraviolet light, for example, for several to about 20 minutes (typically for 5 minutes, 15 minutes, or 18 minutes) by virtue of the presence of the aliphatic polycarbonate-containing layer with multiple island-shaped portions 24, 24, 24.

FIG. 11 shows a graph where changes in water repellency are plotted against exposure time to ultraviolet light for the aliphatic polycarbonate-containing layer formed with aliphatic polycarbonate according to this embodiment (polypropylene carbonate (PPC) as a representative example) and a known silicon resin layer as Comparative Example. The water repellency in this graph is expressed in terms of the contact angle with pure water on a surface of a layer formed with each material, the layer being a target for measurements. Moreover, Table 1 shows how the water repellency and the retention percentages of the contact angle relative to the reference contact angle (100%) before exposure to ultraviolet light (that is, at Time 0) change over the exposure time to ultraviolet light for the aliphatic polycarbonate-containing layer formed with aliphatic polycarbonate according to this embodiment (as representative examples, polyethylene carbonate (PEC), polypropylene carbonate (PPC), and polybutylene carbonate (PBC)) and the silicon resin layer, a polyimide layer, and a polyethylene terephthalate (PET) layer as Comparative Examples.

It is noted that the contact angles shown in FIG. 11 and Table 1 were measured by a method in accordance with the (θ/2) method. Further, the solid line (diamonds) in FIG. 11 represents results for the aliphatic-polycarbonate layer according to this embodiment when preliminary annealing was performed at 150° C. In addition, the alternate long and short dash line (circles) in FIG. 11 represents results when the silicon resin as Comparative Example was heated at 150° C., and the broken line (squares) in FIG. 11 presents results when the silicon resin as Comparative Example was heated at 450° C. Further, among the numerical values shown in Table 1, those outside the parentheses represent the contact angles (deg.), and those inside the parentheses represent the retention percentages (%). Moreover, the retention percentages are selected from representative values of the results obtained from multiple experiments.

TABLE 1

| Material used | Exposure time to ultraviolet light (min.) | | | |
|---|---|---|---|---|
| | 0 | 5 | 15 | 18 |
| Polyethylene carbonate (PEC) | >65 deg. | >45 deg. (about 70%) | >50 deg. (about 77%) | >55 deg. (about 85%) |
| Polypropylene carbonate (PPC) | >75 deg. | >60 deg. (about 85%) | >60 deg. (about 80%) | >60 deg. (about 80%) |
| Polybutylene carbonate (PBC) | >80 deg. | >75 deg. (about 94%) | >75 deg. (about 94%) | >75 deg. (about 94%) |
| Polyimide | >55 deg. | <15 deg. (about 27%) | <20 deg. (about 36%) | <20 deg. (about 36%) |
| Silicon resin | >90 deg. | <60 deg. (about 53%) | <10 deg. (about 11%) | <10 deg. (about 11%) |
| Polyethylene terephthalate (PET) | >70 deg. | <35 deg. (about 50%) | <20 deg. (about 29%) | <15 deg. (about 21%) |

FIG. 11 has revealed that the contact angle of polypropylene carbonate with pure water showed a slight initial decrease after exposure to ultraviolet light, but, after that (after about 3 minutes), became stable and was maintained at around 60° (60 deg.) or more (more specifically, 65° or more or more than 65°). In contrast, the two results from Comparative Examples showed that the contact angle of the silicon resin with pure water before exposure to ultraviolet light was higher than that of polypropylene carbonate, but the contact angle continued to decline almost linearly after exposure to ultraviolet light regardless of different heating temperatures. Further, when the irradiation time with ultraviolet light, in other words, the exposure time to ultraviolet light, was 5 minutes or more, the contact angle of polypropylene carbonate with pure water and the contact angles of two Comparative Examples showed significant differences as shown in FIG. 11. Therefore, it is worth noting that the contact angle of a surface of the aliphatic polycarbonate-containing layer 22 with pure water is 60° or more (further, 65° or more or more than 65°) even when at least the surface thereof is exposed to ultraviolet light including a wavelength of 180 nm or more and 370 nm or less for 5 minutes.

Further, Table 1 indicates that various types of aliphatic polycarbonate maintain a contact angle of at least 50° or more (more than 50° in a narrower sense as shown in Table 1) when the exposure time to ultraviolet light is 15 minutes, and also maintain a contact angle of at least 55° or more (more than 55° in a narrower sense as shown in Table 1) even when the exposure time is 18 minutes. In particular, it has demonstrated that polypropylene carbonate (PPC) and polybutylene carbonate (PBC) maintain a contact angle of at least 60° or more (more than 60° in a narrower sense as shown in Table 1) when the exposure time is anywhere between 5 minutes to 18 minutes. It is noted that interestingly, the contact angle of polyethylene carbonate (PEC) was found to be larger when exposed for 15 minutes or 18 minutes than when exposed for 5 minutes. The reason of this is not conclusively understood at present. Nonetheless, one possibility is as follows. A fresh portion of polyethylene carbonate (PEC) continuously appears on the surface because polyethylene carbonate (PEC) is etched faster than the binding rate of a hydroxy group (OH group) to the surface of polyethylene carbonate (PEC) during exposure treatment with the ultraviolet light (including a case where ozone ($O_3$) is present in the treatment atmosphere).

Moreover, when FIG. 11 and Table 1 are seen from a different point of view, the results from the silicon resin as Comparative Example show a decrease down to about 45 to about 62% after 5 minutes, and a decrease down to about 8 to about 11% after 10 minutes or later relative to the reference contact angle (100%) before irradiation with ultraviolet light (that is, at Time 0). In addition, the results from the other two materials as Comparative Examples (the polyimide layer and the polyethylene terephthalate layer) show a decrease down to about 27 to about 50% after 5 minutes, and a decrease down to about 29 to about 36% after 15 minutes relative to the reference contact angle (100%) before irradiation with ultraviolet light (that is, at Time 0).

Meanwhile, analysis on the aforementioned retention percentage has revealed that the retention percentage for the aliphatic polycarbonate-containing layer according to this embodiment is maintained at about 70% or more (more than 70% in a narrower sense as shown in Table 1) even after 5 minutes relative to the reference contact angle (100%) before irradiation with ultraviolet light (that is, at Time 0). In addition, the analysis also has revealed that in particular, when polypropylene carbonate or polybutylene carbonate is used, the retention percentage is maintained at about 85% or more (more than 85% in a narrower sense as shown in Table 1) even after 5 minutes, and maintained at about 83% or more (more than 83% in a narrower sense) even after 10 minutes relative to the reference contact angle (100%) before irradiation with ultraviolet light (that is, at Time 0). Further, the analysis has also revealed that in particular, polypropylene carbonate or polybutylene carbonate maintains a retention percentage as very high as about 80% or more (more than 80% in a narrower sense as shown in Table 1) even after 15 minutes or 18 minutes.

Therefore, these results demonstrate that the aliphatic polycarbonate-containing layer according to this embodiment can maintain a contact angle of at least 70% or more (typically more than 70%, more hopefully 80% or more) at least after 5 minutes, 10 minutes, 15 minutes, or 18 minutes of irradiation with ultraviolet light relative to the reference contact angle (100%) before irradiation with ultraviolet light (that is, at Time 0). Thus, these results also demonstrate that the aliphatic polycarbonate-containing layer according to this embodiment is excellent in terms of the retention percentage of the contact angle or the retention capability of the contact angle.

Further, FIG. 12 is a light microscope image showing an example of the water repellent performance of the aliphatic polycarbonate-containing layer according to this embodiment shown in FIG. 11 and Table 1 which had been exposed to ultraviolet light. It is noted that the irradiation time with ultraviolet light in FIG. 12 was 6 minutes. When a 20-µL (microliter) water droplet was dropped on the aliphatic polycarbonate-containing layer which had been irradiated with ultraviolet light, the water droplet was observed to be clearly repelled by the aliphatic polycarbonate-containing layer at a region indicated by the symbol X in FIG. 12. It is noted that the result from polypropylene carbonate as a representative example of aliphatic polycarbonate is shown in FIG. 12, but a similar result can be obtained from a type of aliphatic polycarbonate other than polypropylene carbonate.

In this embodiment, after the aliphatic polycarbonate-containing layer with multiple island-shaped portions (typically pattern-formed) 24, 24, 24 which has been irradiated with ultraviolet light is formed, the arrangement step of arranging the metal ink 72 on the base material 10 is performed using a known metal-ink applicator (for example, an applicator where the ink-jet method is used) 90. It is noted that known metal-catalyst nanoparticles can be used as the metal ink 72 in this embodiment. Examples thereof include silver nanoparticle ink (cat # JAGLT-01, DIC Corporation), but other known metal inks can also be used. Further, in this embodiment, the metal ink is arranged only at a portion of regions sandwiched by the respective island-shaped portions of the aliphatic polycarbonate-containing layer 24, 24, 24, but in another adoptable aspect, the metal ink 72 may be arranged within all of the regions.

The composite member 100 shown in FIG. 9 is manufactured via the aforementioned arrangement step of the metal ink 72. The metal ink 72 can serve as an intermediate material for metal wiring as described below.

In this embodiment, a heating step is further performed after the arrangement step, the heating step including heating the aliphatic polycarbonate-containing layer 24, 24, 24 and the metal ink 72 at or above a temperature where the aliphatic polycarbonate-containing layer 24, 24, 24 is decomposed or removed, and a metal layer 74 is formed from the metal ink 72. As a result, the composite member 200 in which the metal layer 74 is arranged on the base material 10 can be manufactured as shown in FIG. 10. Here, in the heating step, the aliphatic polycarbonate-containing layer 24, 24, 24 as a sacrifice layer will be reliably, in other words, substantially decomposed or removed. As a result, the composite member 200 includes the metal layer 74 arranged on the base material 10 having substantially no residues left. This confers high reliability and stability on the composite member 200.

It is noted that when the metal ink 72 serves as an intermediate material for metal wiring, the metal layer 74 formed by heating the metal ink 72 serves as metal wiring. However, the metal layer 74 formed using the metal ink 72 as a starting material can also have a function different from wiring (for example, as an electrode and like).

The heating step in this embodiment will be described in more detail. In this embodiment, heat treatment of the aliphatic polycarbonate-containing layer 24, 24, 24 and the metal ink 72 arranged on the base material 10 was performed at about 150° C. for about 30 minutes using a known heater. As a result, the composite member 200 including the metal layer 74 having a fine width can be manufactured. It is noted that the known heater used in this embodiment is a hot plate available from As One Corp. (Model TH-900), but the heating means is not limited to such a heater. In other embodiments, for example, heaters such as other known hot plates can be used.

<Variation of First Embodiment>

Meanwhile, in the above embodiment, the metal ink 72 is used as a starting material for forming the metal layer 74. However, in a variation of the first embodiment, a step of forming a starting material layer for use in the known electroless plating method, that is, a starting material layer for a metal plated layer may be performed in place of performing arrangement of the metal ink 72.

For example, FIG. 16 shows a side view of the overall configuration of a composite member 400 from this variation. The composite member 400 includes a starting material layer 73 for a metal plated layer on the base material 10 at at least a portion of a region sandwiched by the respective island-shaped portions of the aliphatic polycarbonate-containing layer with multiple island-shaped portions arranged on the base material 10. It is noted that the composite member 400 is subjected to each of the steps before the ultraviolet light emitting step in the first embodiment, and then an arrangement step different from the arrangement step in the first embodiment is performed.

Specifically, after the aliphatic polycarbonate-containing layer with multiple island-shaped portions (typically pattern-formed) 24, 24, 24 which has been irradiated with ultraviolet light is formed, an arrangement step is performed, the arrangement step including arranging a starting material layer for a metal plated layer at at least a portion of a region on the substrate 10 sandwiched by the respective island-shaped portions of the aliphatic polycarbonate-containing layer 24, 24, 24. As a result, the composite member 400 including the starting material layer for a metal plated layer and the aliphatic polycarbonate-containing layer 24, 24, 24 can be manufactured. It is noted that an example of a starting material which can be used as the starting material layer 73 for a metal plated layer in this embodiment is known metal-catalyst nanoparticles.

After the above arrangement step, a heating step is performed, the heating step including heating the aliphatic polycarbonate-containing layer 24, 24, 24 and the starting material layer 73 for a metal plated layer at or above a temperature where the aliphatic polycarbonate-containing layer 24, 24, 24 is decomposed or removed (for example, 180° C. or more, preferably 250° C. or more, and even more preferably 260° C. or more). As a result, a composite member 500 in which the starting material layer 73 for a metal plated layer is arranged on the base material 10 as shown in FIG. 17 can be manufactured. It is noted that the aliphatic polycarbonate-containing layer 24, 24, 24 as a sacrifice layer will be decomposed or removed reliably, in other words, leaving substantially no residues in the above heating step.

Subsequently, a metal-layer forming step of forming a metal layer (for example a copper (Cu) layer) 75 by the known electroless plating method may further be performed to manufacture a composite member 600 as shown in FIG. 18.

Alternative Embodiment 1

Further, in a preferred aspect, metal layers 74, 75 are used as metal wiring or conductor layers in the composite member 200 on which the metal layers 74, 75 are arranged on the base materials 10 shown in the first embodiment or the above variation of the first embodiment.

For example, FIG. 13 shows a top view of a portion of the composite member 200 constituting a composite member 300A as one embodiment which can be used. Further, FIG. 14 shows a side view (a) and a top view (b) of the composite member 300A as one embodiment which can be used.

Prepared are the composite member 200 including mesh-shaped wiring of a conductor layer 74a formed from the metal layer 74 or the metal layer 75 provided only in the vertical direction along the surface of the paper as shown in FIG. 13(a) and the composite member 200 including mesh-shaped wiring of a conductor layer 74b formed from the metal layer 74 or the metal layer 75 provided only in the horizontal direction along the surface of the paper as shown in FIG. 13(b). Then, a metal-layer forming step of overlaying these two composite members 200 as electrodes through a dielectric layer 50 as shown in FIGS. 14(a) and (b). As a result, the composite member 300A having a structure in which the two composite members 200 are overlaid through the dielectric layer 50 can be manufactured. It is noted that a honeycomb structure may be used instead of the above mesh-shaped structure.

Moreover, the width of the typical conductor layers 74a, 74b is about 500 nm to about 20 µm. The above width of wiring can be obtained for the width of a region (a gap) sandwiched by the respective island-shaped portions of the aliphatic polycarbonate-containing layer with multiple island-shaped portions by at least the nano-imprinting method according to the first embodiment. Therefore, according to this embodiment, the composite member 300A can be manufactured by an environment friendly and low-energy process instead of a process requiring a relativity long period of time and/or expensive equipment such as the vacuum process or a process using the photolithography method which has been conventionally used.

Advantageously, the above very fine width of wiring is usually too fine to be visible to the human eye even when the wiring itself is not transparent. As a result, the composite member 300A can be used as a conductor layer, for example, for a so-called capacitive touch panel.

Alternative Embodiment 2

It is noted that a capacitive touch panel as shown in FIGS. 14 and 15 is presented as an example of the composite member, but the detection method for touch panels is not limited to the capacitive sensing method. For example, in another preferred aspect, the metal layer 74 according to the first embodiment may be used as a conductor layer in a resistive touch panel.

For example, FIG. 15 shows a top view of a composite member 300B as one embodiment which can be used. The composite member 300B shown in FIG. 15 has a structure where the composite member 200 including wiring of a conductor layer 74c formed from the metal layer 74 or the metal layer 75 provided only in the vertical direction along the surface of the paper and the composite member 200 including wiring of a conductor layer 74d formed from the metal layer 74 or the metal layer 75 provided only in the horizontal direction along the surface of the paper are overlaid so as to be separated by a known distance. It is noted that a person skilled in the art could understand that the two composite members 200 are overlaid so as to be separated by a known distance, for example, using a known spacer although not immediately seen in the top view of FIG. 15.

Moreover, the width of typical wiring of the conductor layers 74c and 74d is about 500 nm to about 20 µm. The above width of wiring can be obtained for the width of a region (a gap) sandwiched by the respective island-shaped portions of the aliphatic polycarbonate-containing layer with multiple island-shaped portions by at least the nano-imprinting method according to the first embodiment. Therefore, according to this embodiment, the composite member 300B can be manufactured by an environment friendly and low-energy process instead of a process requiring a relativity long period of time and/or expensive equipment such as the vacuum process or a process using the photolithography method which has been conventionally used.

Advantageously, the above very fine width of wiring is usually too fine to be visible to the human eye even when the wiring itself is not transparent. As a result, the composite member 300B can be used as a conductor layer, for example, in a so-called resistive touch panel.

It is noted that the composite member 100 and the composite member 200 according to the first embodiment can also be applied to devices other than touch panels (for example, organic EL devices, flexible printed wiring boards, or flexible piezoelectric sensor sheets).

Therefore, when a wiring formation step is performed in which the conductor layers 74a, 74b, 74c, 74d are formed in a grid-shaped pattern as shown in FIGS. 13 to 15 by overlaying two or more of the composite members 200, 200 after performing each step of the first embodiment, the environmental load and manufacturing cost can be reduced when manufacturing various devices such as touch panels.

Alternative Embodiment 3

Meanwhile, in the first embodiment, aliphatic polycarbonate is decomposed only by heat treatment, but in this embodiment, aliphatic polycarbonate is found to be able to be substantially decomposed or removed by an alternative means. For example, heat treatment performed while being irradiated with ultraviolet light including a wavelength of 180 nm or more and 370 nm or less with a known ultraviolet light emitting device (Model UV-300H-E, Samco Inc.) can better facilitate decomposition or removal of aliphatic polycarbonate. It is noted that generation of ozone ($O_3$) in a treatment atmosphere or intentional introduction of ozone ($O_3$) into a treatment atmosphere during the treatment with ultraviolet light is acceptable.

Studies and analyses by the present inventors demonstrated that aliphatic polycarbonate was able to be substantially or mostly eliminated when the above heat treatment was performed at a lower temperature than the heating temperature used in the first embodiment (for example, 120° C. or more and less than 180° C., typically 120° C. or more and 140° C. or less). This means that, in this embodiment, when the heat treatment temperature required for forming a metal layer from a metal ink is similar to or lower than a temperature where aliphatic polycarbonate can be substantially or mostly eliminated, the composite member 200 can be formed by simply heating to that temperature where aliphatic polycarbonate can be substantially or mostly eliminated.

Alternative Embodiment 4

Furthermore, in another variation of the first embodiment, the present inventors found that there exists an alternative method of decomposing aliphatic polycarbonate without performing heat treatment. For example, the aliphatic polycarbonate-containing layer may be exposed to plasma generated under an atmospheric pressure atmosphere to decompose aliphatic polycarbonate without performing heat treatment. In this variation, heat treatment is not performed when exposed to plasma generated under an atmospheric pressure atmosphere. This means that the composite member 200 can be formed by simply heating to a heat treatment temperature required for forming a metal layer from a metal ink apart from the above plasma treatment.

As described above, the disclosure of the above embodiments is provided for illustrative purposes only, and shall not be used to limit the present invention. Furthermore, variations within the scope of the present invention, including other combinations of the embodiments, shall also be included within the scope of the claims.

INDUSTRIAL APPLICABILITY

The present invention can be applied broadly to the fields of electronic devices including a mobile terminal, an information appliance, a sensor, or any other publicly known electric appliance including various semiconductor elements, MEMS (Micro Electro Mechanical Systems) or NEMS (Nano Electro Mechanical Systems), and medical devices, for example.

DESCRIPTION OF REFERENCE SIGNS

10 Base Material
10a Surface of base material
22 Aliphatic polycarbonate-containing layer
22a Region imprinted with protruded portion of mold M1
24 Aliphatic polycarbonate-containing layer which has been irradiated with ultraviolet light
72 Metal ink
73 Starting material layer for metal plated layer
74, 75 Metal layer
74a, 74b, 74c, 74d Conductor layer
80 Ultraviolet emitting device
90 Applicator
100, 200, 300A, 300B, 400, 500, 600 Composite member

The invention claimed is:

1. A composite member comprising:
a base material;
an aliphatic polycarbonate-containing layer with multiple island-shaped portions arranged on the base material; and
a metal ink, wherein
at least a surface of the aliphatic polycarbonate-containing layer has a contact angle of 50° or more between pure water and the surface when exposed to ultraviolet light including a wavelength from 180 nm or more to 370 nm or less for 15 minutes, and
the metal ink is arranged on the base material at at least a portion of a region sandwiched between the respective island-shaped portions of the aliphatic polycarbonate-containing layer.

2. A composite member comprising:
a base material;
an aliphatic polycarbonate-containing layer with multiple island-shaped portions arranged on the base material; and
a starting material layer for a metal plated layer, wherein
at least a surface of the aliphatic polycarbonate-containing layer has a contact angle of 50° or more between pure water and the surface when exposed to ultraviolet light including a wavelength from 180 nm or more to 370 nm or less for 15 minutes, and
the starting material layer is arranged on the base material at at least a portion of a region sandwiched between the respective island-shaped portions of the aliphatic polycarbonate-containing layer.

3. The composite member according to claim 1, wherein the surface has a contact angle of 60° or more between pure water and the surface when exposed to the ultraviolet light for 5 minutes.

4. The composite member according to claim 1, wherein the aliphatic polycarbonate-containing layer is substantially decomposed or removed when heated at a temperature from 120° C. or more to less than 180° C. while being irradiated with ultraviolet light including a wavelength from 180 nm or more to 370 nm or less.

5. The composite member according to claim 1, wherein the aliphatic polycarbonate-containing layer is substantially decomposed or removed when heated at a temperature of 180° C. or more.

6. The composite member according to claim 1, wherein the aliphatic polycarbonate-containing layer has a shortest distance from 500 nm or more to 20 μm or less between the respective island-shaped portions.

7. The composite member according to claim 1, wherein the metal ink is formed of an intermediate material for metal wiring.

8. A method of manufacturing a composite member, the method comprising:
an ultraviolet light emitting step of emitting ultraviolet light including a wavelength from 180 nm or more to 370 nm or less to at least a surface of an aliphatic polycarbonate-containing layer with multiple island-shaped portions arranged on a base material and at least a surface of the base material, where the at least a surface of the aliphatic polycarbonate-containing layer has a contact angle of 50° or more between pure water and the surface when exposed to the ultraviolet light including a wavelength from 180 nm or more to 370 nm or less for 15 minutes; and
an arrangement step of, after the ultraviolet light emitting step, arranging a metal ink on the base material at at least a portion of a region sandwiched between the respective island-shaped portions of the aliphatic polycarbonate-containing layer.

9. A method of manufacturing a composite member, the method comprising:
an ultraviolet light emitting step of emitting ultraviolet light including a wavelength from 180 nm or more to 370 nm or less to at least a surface of an aliphatic polycarbonate-containing layer with multiple island-shaped portions arranged on a base material and at least a surface of the base material, where the at least a surface of the aliphatic polycarbonate-containing layer has a contact angle of 50° or more between pure water and the surface when exposed to the ultraviolet light including a wavelength from 180 nm or more to 370 nm or less for 15 minutes; and
an arrangement step of, after the ultraviolet light emitting step, arranging a starting material layer for a metal plated layer on the base material at at least a portion of a region sandwiched between the respective island-shaped portions of the aliphatic polycarbonate-containing layer.

10. The method of manufacturing a composite member according to claim 8, further comprising
a heating step of, after the arrangement step, heating the aliphatic polycarbonate-containing layer and the metal ink at or above a temperature where the aliphatic polycarbonate-containing layer is decomposed or removed and at or above a temperature where a metal layer is formed from the metal ink.

11. The method of manufacturing a composite member according to claim 9, further comprising
a heating step of, after the arrangement step, heating the aliphatic polycarbonate-containing layer and the starting material layer at or above a temperature where the aliphatic polycarbonate-containing layer is decomposed or removed.

12. The method of manufacturing a composite member according to claim 10, wherein
the heating step includes applying heat at or above a temperature where the aliphatic polycarbonate-containing layer is decomposed or removed while being irradiated with ultraviolet light including a wavelength from 180 nm or more to 370 nm or less.

13. The method of manufacturing a composite member according to claim 8, wherein
the aliphatic polycarbonate-containing layer with the multiple island-shaped portions is formed by performing an imprinting process on the aliphatic polycarbonate-containing later with the aliphatic polycarbonate-containing layer heated at a temperature from 150° C. or more to 300° C. or less, and then exposing the entire surface of the aliphatic polycarbonate-containing layer subjected to the imprinting process to plasma.

14. The method of manufacturing a composite member according to claim 13, wherein
the imprinting process is performed at a pressure in a range from 0.1 MPa or more to 20 MPa or less.

15. The method of manufacturing a composite member according to claim 8, further comprising
a metal-layer forming step of forming a mesh-shaped or grid-shaped conductor layer as seen in a top view by overlaying a plurality of the composite members manufactured according to the method of manufacturing a composite member.

16. The composite member according to claim 2, wherein
the surface has a contact angle of 60° or more between pure water and the surface when exposed to the ultraviolet light for 5 minutes.

17. The composite member according to claim 2, wherein
the aliphatic polycarbonate-containing layer is substantially decomposed or removed when heated at a temperature from 120° C. or more to less than 180° C. while being irradiated with ultraviolet light including a wavelength from 180 nm or more to 370 nm or less.

18. The composite member according to claim 2, wherein
the aliphatic polycarbonate-containing layer has a shortest distance from 500 nm or more to 20 μm or less between the respective island-shaped portions.

19. The method of manufacturing a composite member according to claim 11, wherein
the heating step includes applying heat at or above a temperature where the aliphatic polycarbonate-containing layer is decomposed or removed while being irradiated with ultraviolet light including a wavelength from 180 nm or more to 370 nm or less.

20. The method of manufacturing a composite member according to claim 9, wherein
the aliphatic polycarbonate-containing layer with the multiple island-shaped portions is formed by performing an imprinting process on the aliphatic polycarbonate-containing later with the aliphatic polycarbonate-containing layer heated at a temperature from 150° C. or more to 300° C. or less, and then exposing the entire surface of the aliphatic polycarbonate-containing layer subjected to the imprinting process to plasma.

21. The method of manufacturing a composite member according to claim 9, further comprising
a metal-layer forming step of forming a mesh-shaped or grid-shaped conductor layer as seen in a top view by overlaying a plurality of the composite members manufactured according to the method of manufacturing a composite member.

* * * * *